(12) United States Patent
Kuratomi et al.

(10) Patent No.: US 7,037,760 B2
(45) Date of Patent: May 2, 2006

(54) FABRICATION METHOD OF SEMICONDUCTOR INTEGRATED CIRCUIT DEVICE

(75) Inventors: Bunshi Kuratomi, Kodaira (JP); Fukumi Shimizu, Tachikawa (JP)

(73) Assignees: Renesas Technology Corp., Tokyo (JP); Renesas Eastern Japan Semiconductor, INC, Tokyo (JP)

( * ) Notice: Subject to any disclaimer, the term of this patent is extended or adjusted under 35 U.S.C. 154(b) by 204 days.

(21) Appl. No.: 10/682,028

(22) Filed: Oct. 10, 2003

(65) Prior Publication Data

US 2004/0166605 A1    Aug. 26, 2004

(30) Foreign Application Priority Data

Oct. 10, 2002  (JP) .............................. 2002-297820

(51) Int. Cl.
*H01L 21/44* (2006.01)

(52) U.S. Cl. ........................ 438/127; 438/125; 438/126
(58) Field of Classification Search ......... 438/125–127
See application file for complete search history.

(56) References Cited

U.S. PATENT DOCUMENTS

| | | | |
|---|---|---|---|
| 5,728,600 A | * | 3/1998 | Saxelby et al. ........ 264/272.11 |
| 5,834,035 A | * | 11/1998 | Osada et al. ................. 425/116 |
| 5,910,010 A | * | 6/1999 | Nishizawa et al. ........... 438/15 |
| 6,498,055 B1 | * | 12/2002 | Fukuda et al. .............. 438/127 |
| 6,676,885 B1 | * | 1/2004 | Shimizu et al. ............. 264/511 |
| 2005/0070047 A1 | * | 3/2005 | Kuratomi et al. ........... 438/107 |

FOREIGN PATENT DOCUMENTS

JP            10-092853            10/1998

* cited by examiner

*Primary Examiner*—Christian D. Wilson
(74) *Attorney, Agent, or Firm*—Antonelli, Terry, Stout and Kraus, LLP.

(57) ABSTRACT

A method of fabricating a semiconductor integrated circuit device uses a mold which is provided with a plurality of air vents and movable pins which are formed such that the movable pins include grooves in the distal ends thereof which project into the air vents. By clamping the mold in a state such that the distal ends of the movable pins are pushed against a multi-cavity board at the time of clamping the mold, resin can be filled while leaking air inside the cavity through the grooves formed in the distal ends of the movable pins by setting the depths of the respective air vents to a fixed value irrespective of the irregularities in thickness of the multi-cavity boards. Accordingly, it is possible to prevent insufficient filling of resin in the cavity, the leaking of resin or defective welding, whereby the yield rate of products can be enhanced.

19 Claims, 21 Drawing Sheets

9 : SEALING RESIN

1 : MOVABLE PIN
1a : GROOVE
2 : SPRING FOR DRIVING MOVABLE PIN (SPRING)
3 : FILM
6 : FORMING MOLD
7 : UPPER MOLD (FIRST MOLD)
7c : AIR VENT
7g, 8h : MOLD SURFACE
7h : COLLECTIVE CAVITY
7m, 8f : SUCTION HOLE
8 : LOWER MOLD (SECOND MOLD)
40 : MULTI-CAVITY BOARD (BOARD)

9 : SEALING RESIN

7j: RAMMER FOR MOVABLE PIN (PUSHER ROD)

4 : SEMICONDUCTOR CHIP
41 : PRINTED WIRING BOARD (BOARD)
43 : CSP (SEMICONDUCTOR INTEGRATED CIRCUIT DEVICE)

40b: CHIP MOUNTING AREA
40c: DEVICE AREA (DEVICE FORMING AREA)

50: CSP (SEMICONDUCTOR INTEGRATED CIRCUIT DEVICE)
51: MULTI-LAYERED PRINTED WIRING BOARD (BOARD)

51c: CORE MEMBER

58 : BOARD FOR CARDS (BOARD)
59 : CARD-TYPE PACKAGE
(SEMICONDUCTOR INTEGRATED CIRCUIT DEVICE)

FABRICATION METHOD OF SEMICONDUCTOR INTEGRATED CIRCUIT DEVICE

BACKGROUND OF THE INVENTION

The present invention relates to a fabrication technique for use in the manufacture of a semiconductor integrated circuit device, and, more particularly, to a technique which is applicable to resin molding in assembly using boards.

In conventional resin molding, opening degree adjustment means, which adjusts the opening degree of each air vent portion, is provided to the air vent portion of a mold, and a driving mechanism is provided to drive the opening degree adjustment means (for example, refer to Patent Document 1: Japanese Unexamined Patent Publication No. Hei 10(1998)-92853 (FIG. 1)).

To perform transfer molding by mounting semiconductor integrated circuit chips on a multilayered printed wiring circuit board or the like and inserting the multilayered printed wiring circuit board or the like between molds, in contrast to general lead frames having a relatively small thickness error or the like, the thickness error is relatively large, and, hence, various drawbacks arise.

That is, when the thickness is excessively small, a gap is formed between an upper mold and a peripheral portion of the board, and, hence, the leaking of sealed resin occurs. Accordingly, to compensate for the small thickness, the clamping force is increased so as to depress the board by approximately 1% of the thickness, thus preventing the leaking of sealed resin. However, in this case, when the thickness is excessively large, excessive deformation arises in the board.

Further, it may be considered that the occurrence of voids or the like due to clogging of resin in the air vent portion can be suppressed by preliminarily preparing data corresponding to the thickness of a lead frame at the time of performing resin molding (resin filling) and adjusting the opening degree adjustment means in the air vent portion of a sealed mold by inputting such data at the time of resin sealing. However, in such a resin sealing operation, there arise drawbacks in that each time the thickness of the lead frame is changed, it is necessary to perform the operation of inputting data, and, at the same time, it is necessary to prepare input data for adjusting the opening degree adjustment means corresponding to the frame thickness.

Further, when the resin sealing operation is performed using a resin-made board which is softer than the lead frame, unevenness is liable to occur on a surface of the board due to warping of the board or the presence/non-presence of wiring, and, hence, in the above-mentioned resin sealing operation, there arises a drawback in that the opening degree adjustment of the air vent portion in response to a change in the thickness of the board and the shape of the surface of the board is extremely difficult.

Further, when it is necessary to perform resin molding of a plurality of boards using one mold at a time, the above-mentioned method requires a driving mechanism for the open degree adjustment means in the sealing mold for every air vent portion, and, hence, the structure of the sealing mold becomes complicated and large-sized.

Accordingly, it is an object of the present invention to provide a method of fabrication of a semiconductor integrated circuit device which can enhance the yield rate of products.

It is a further object of the present invention to provide a method of fabrication of a semiconductor integrated circuit device which can reduce the fabrication cost.

It is a still further object of the present invention to provide a method of fabrication method of a semiconductor integrated circuit device which can prevent the occurrence of drawbacks at the time of transporting boards in succeeding steps.

It is another object of the present invention to provide a method of fabrication of a semiconductor integrated circuit device which can reduce the mold clamping force.

The above-mentioned and other objects and novel features of the present invention will become apparent from the description of this specification and the attached drawings.

SUMMARY OF THE INVENTION

A summary of typical aspects of the invention disclosed in the present application is as follows. That is, the present invention is characterized by the fact that resin molding is performed by filling sealing resin in the inside of a cavity in a state in which the depths of air vents in a mold for resin molding are set to a fixed value.

Further, a summary of various features of the present invention will be described in the following paragraphs.

1. A method of fabrication of a semiconductor integrated circuit device comprises the steps of:
  (a) preparing a multilayered printed wiring circuit board;
  (b) mounting semiconductor chips on the multilayered printed wiring circuit board;
  (c) arranging the multilayered printed wiring circuit board over which the semiconductor chips are mounted on a mold surface of a mold for resin molding and, thereafter, closing the mold; and
  (d) filling sealing resin in the inside of a cavity formed in the mold such that respective depths of a plurality of air vents formed through the cavity are set to a fixed value by projecting movable pins provided for respective air vents toward the air vent side by pushing using the pressure of a spring.

2. A method of fabrication of a semiconductor integrated circuit device comprises the steps of:
  (a) preparing a multilayered printed wiring circuit board;
  (b) preparing a mold for resin molding which includes a cavity and a plurality of air vents which are formed to communicate with the cavity, wherein movable pins are provided for respective air vents and a cavity-side depths of the movable pins in the air vents are set to be greater than the depths of the movable pins at the outside of the movable pins;
  (c) mounting semiconductor chips on the multilayered printed wiring circuit board;
  (d) arranging the multilayered printed wiring circuit board over which the semiconductor chips are mounted on a mold surface of the mold and, thereafter, closing the mold; and
  (e) filling sealing resin in the inside of the cavity such that respective depths of the plural air vents are set to a fixed value using movable pins provided for respective air vents.

3. A method of fabrication of a semiconductor integrated circuit device comprising the steps of:
  (a) preparing a multilayered printed wiring circuit board;
  (b) mounting semiconductor chips on the multilayered printed wiring circuit board;
  (c) arranging the multilayered printed wiring circuit board over which the semiconductor chips are mounted on a mold surface of a mold for resin molding and, thereafter, closing the mold; and (d) filling sealing resin in the inside of the cavity such that respective depths of the plural air vents which are formed to be communicated with the cavity of the mold are set to a fixed value by projecting movable pins provided for respective air vents.

4. A method of fabrication of a semiconductor integrated circuit device according to the above-mentioned paragraph 3, wherein grooves are formed over respective distal ends of the plural movable pins and air inside the cavity is leaked to the outside of the cavity through the grooves formed in the respective movable pins at the time of filling resin in the inside of the cavity.

DETAILED DESCRIPTION OF THE PREFERRED EMBODIMENTS

Figure 1:
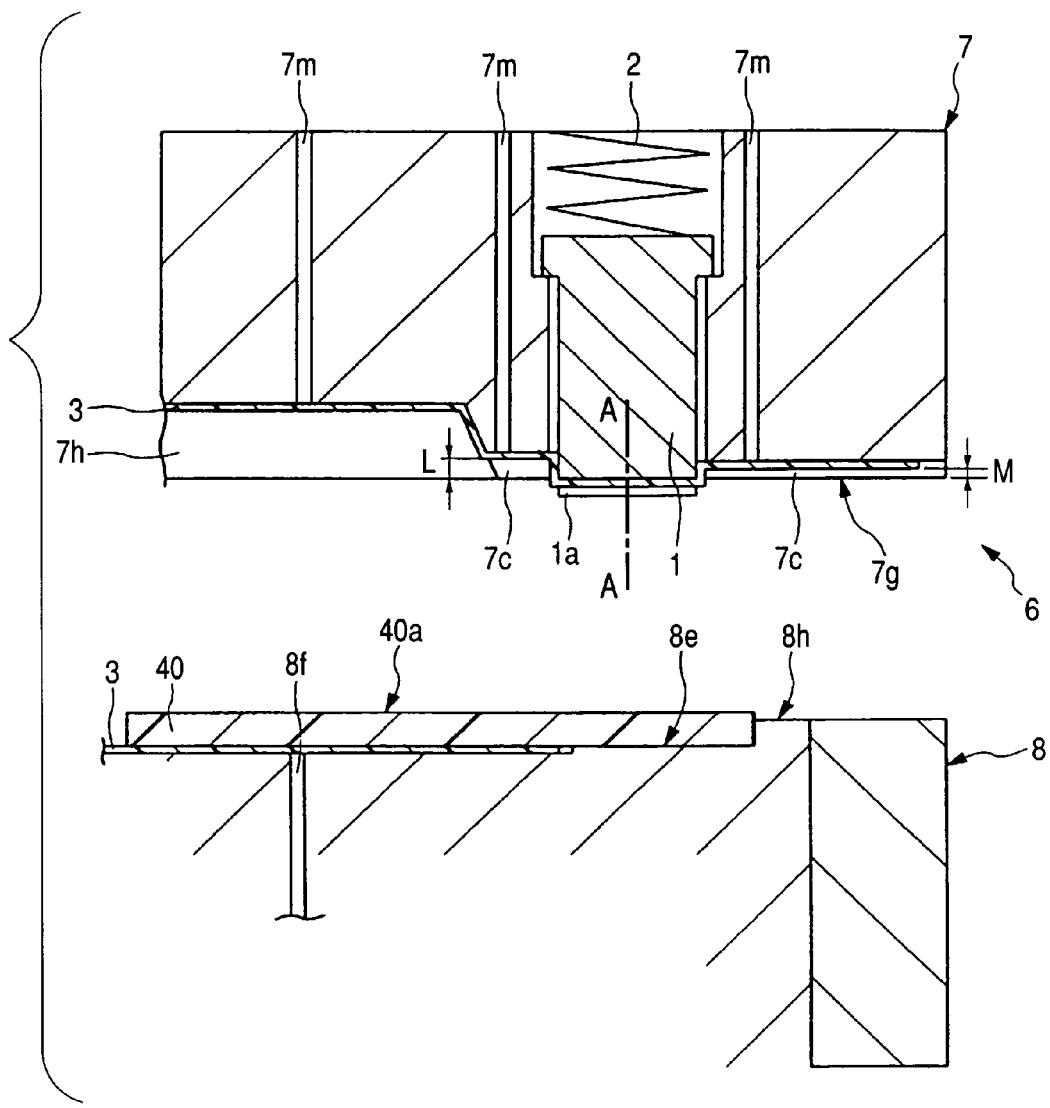
FIG. 1 is an enlarged partial cross-sectional view showing one example of the structure of a mold to be used in a method of fabrication of a semiconductor integrated circuit device according to an embodiment of the present invention, as seen when the mold is in an open state.

Embodiments of the present invention will be explained in detail in conjunction with the accompanying drawings.

Although the explanation will be mainly focused on an example applied to a sheet mold (an example applied to an upper side sheet) hereinafter, the present invention is not limited to such an application. When a sheet is not used, the leaking of resin or the like is liable to easily occur, and, hence, there exists large possibility that the application of the present invention becomes necessary. Further, when a sheet is used, due to a coupled effect between the present invention and the sheet, it is estimated that the mass productivity and the effect of preventing leaking of resin or the like can be largely enhanced.

In this specification, when "multilayered printed wiring circuit board" is referred to, this implies printed wiring circuit boards in two or more layers. Here, "two layers" means that there are two wiring layers. Further, "wiring" includes a land array, an electrode matrix and the like besides usual printed wiring. Further, when "semiconductor integrated circuit device", "integrated circuit chip", "semiconductor chip", "semiconductor pellet" and the like are referred to in this specification, they include not only those elements which are prepared on a silicon wafer, but also those elements which are prepared on other types of board, such as a TFT liquid crystal substrate or the like, unless otherwise specified accordingly.

Further, in the embodiments described hereinafter, when it is necessary for the sake of convenience, the explanation is made by dividing the invention into a plurality of sections or a plurality of embodiments. However, unless otherwise specified particularly, these embodiments are not irrelevant to each other and there exists the relationship that one embodiment is a modification, a detailed explanation or a complementary explanation of a portion or the whole of the other embodiments.

Further, in the embodiments described hereinafter, when reference is made to the number and the like (including a number, numerical values, quantity, range and the like) of elements, unless otherwise specified and unless it is apparent that the number and the like of elements are definitely limited to the specific number in principle, the number and the like are not limited to such specific number and may be a number above or below the specific number.

Further, in the embodiment described hereinafter, it is needless to say that constituent elements (including element steps and the like) are not always indispensable unless otherwise specified or unless they are considered indefinitely indispensable in principle.

In the same manner, in the embodiments described hereinafter, when reference is made with respect to the shape, the positional relationship and the like of the constituent elements, unless otherwise specified or unless it is indefinitely considered unreasonable in principle, these shapes and positional relationships substantially include those which approximate or are similar to these shapes. The same goes for the above-mentioned numerical values and ranges.

Further, in all of the drawings, constitutional elements which have the same functions are given the same symbols and a repeated explanation thereof is omitted.

Embodiment 1

This embodiment 1 is directed to a method of fabrication of a semiconductor integrated circuit device in which the semiconductor integrated circuit device is assembled such that a printed wiring circuit board is used and a sealing body 44 (see FIG. 14) is formed over the board by performing resin molding on the board.

Figure 15:
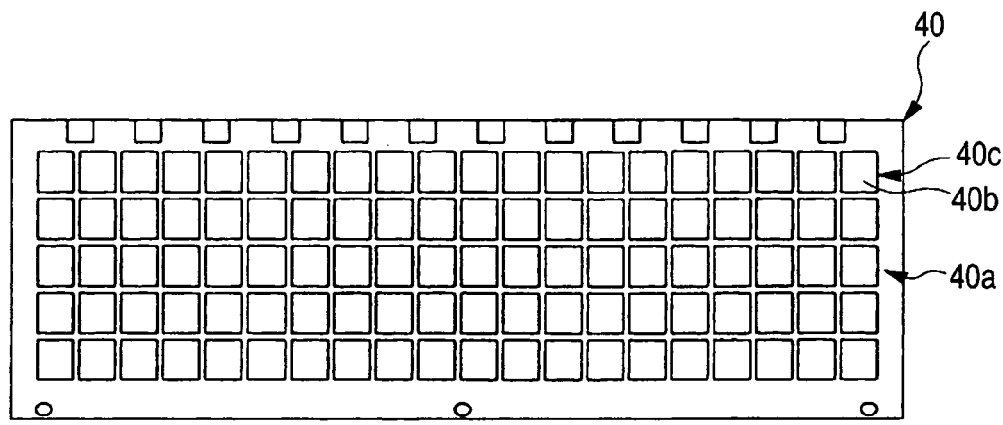
FIG. 15 is a plan view showing one example of the structure of the multi-cavity printed wiring circuit board which is used by the method of fabrication of a semiconductor integrated circuit device according to embodiment 1 of the present invention.

In the explanation of this embodiment 1, a CSP (Chip Size Package) 43, which is assembled using a multi-cavity printed wiring circuit board (board) 40, as shown in FIG. 15, is taken as an example of the semiconductor integrated circuit device.

Figure 14:
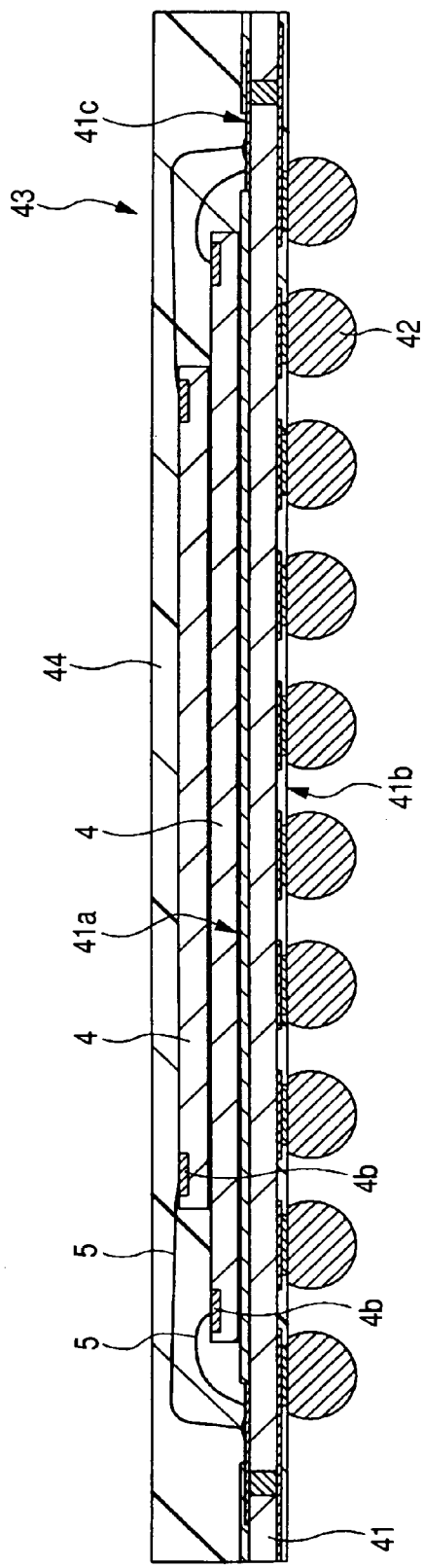
FIG. 14 is a cross-sectional view showing one example of the structure of the semiconductor integrated circuit device which is assembled by the method of fabrication of a semiconductor integrated circuit device according to embodiment 1 of the present invention.

The CSP 43 shown in FIG. 14 is a thin semiconductor package of a chip laminated type. With respect to the structure of the CSP 43, the CSP 43 is constituted of a printed wiring circuit board (board) 41, which has a main surface 41a and a back surface 41b, wherein a chip mounting region 40b and leads 41c, which constitute a plurality of lines shown in FIG. 15, are formed over the main surface 41a. Two semiconductor chips 4 are mounted on the chip mounting region 40b of the main surface 41a of the printed wiring circuit board 41 by lamination, and a plurality of wires 5 respectively connect bonding electrodes 4b of respective semiconductor chips 4 and the leads 41c which correspond to the bonding electrodes 4b. The sealing body 44 seals the semiconductor chips 4 and the plural wires 5 with resin, and solder balls 42 are mounted on the back surface 41b of the printed wiring circuit board 41 and constitute a plurality of external terminals.

Here, the CSP 43 is formed by using a multi-cavity printed wiring circuit board 40 over which a plurality of device regions (device forming regions) 40c, respectively having chip mounting regions 40b, are formed over a main surface 40a in a matrix array. In a resin sealing (resin molding) step after wire bonding, the plural device regions 40c, which are arranged in a matrix array, are covered with one cavity of a mold 6 and resin sealing is collectively formed (hereinafter, such resin sealing method is referred to as collective molding); and, thereafter, the resin sealed structure is divided into pieces by dicing so as to form the CSP 43.

Here, the printed wiring circuit board 41 is a thin board which is constituted by forming wiring made of copper or the like over a resin board made of glass-epoxy-based resin or the like. Further, the sealing body 44 is made of epoxy resin, for example, and is formed by resin molding. Further, the wires 5 are formed of a gold line, for example.

Next, the structure of an upper mold 7, which constitutes a first mold and a lower mold 8, which constitutes a second mold, will be explained with reference to FIG. 1, which molds are used in the resin sealing step of the method of fabrication of the semiconductor integrated circuit device of this embodiment 1. Here, with respect to the first mold and the second mold, the second mold may be constituted by the upper mold 7 and the first mold may be constituted by the lower mold 8.

Figure 5:
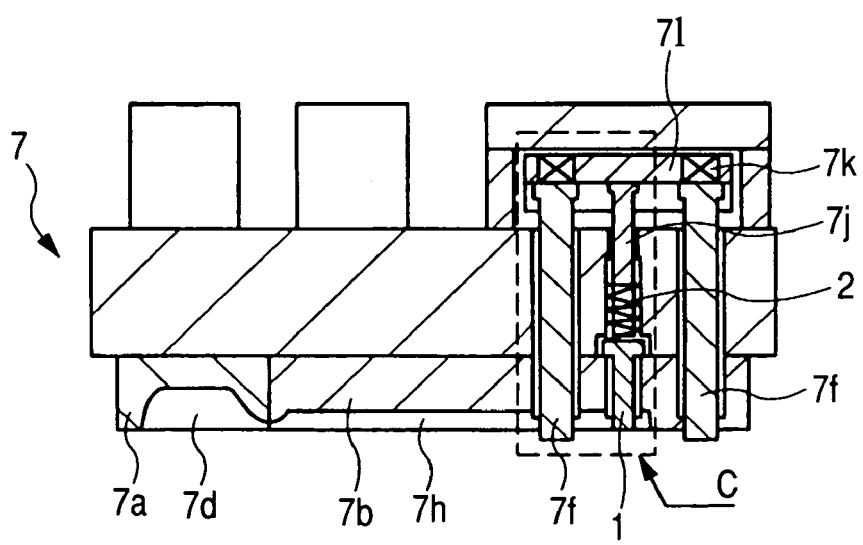
FIG. 5 is a partial cross-sectional view showing one example of the movable pin supporting structure of an upper mold of the mold shown in FIG. 1.

First of all, as shown in FIG. 1 and FIG. 5, the upper mold 7 is mainly constituted of cull blocks 7a and a cavity block 7b, wherein one collective cavity 7h, which is capable of covering the main surface 40a of the multi-cavity printed wiring circuit board 40 at the time of performing resin sealing, is formed in the cavity block 7b.

Figure 6:
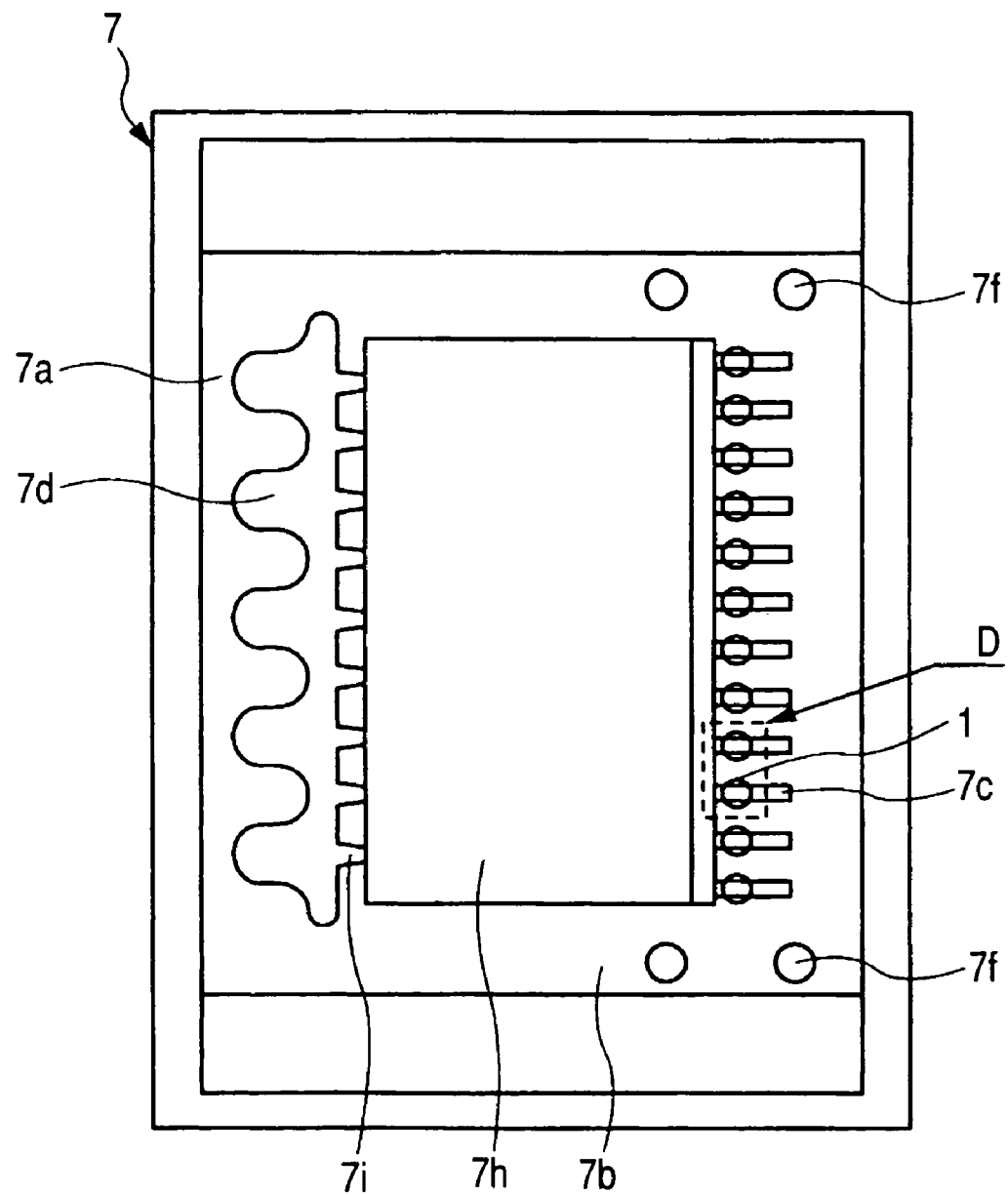
FIG. 6 is a plan view showing one example of the cavity-side structure of the upper mold shown in FIG. 5.

Further, around the collective cavity 7h, as shown in FIG. 6, a plurality of air vents 7c, a plurality of culls 7d and a plurality of gates 7i are formed. Among these elements, the plural gates 7i and the plural air vents 7c are formed in parallel respectively along two opposing longitudinal sides of the rectangular collective cavity 7h such that they face each other, while the culls 7d are formed in a plural number in the vicinity of the gates 7i.

Further, in the upper mold 7, there are a plurality of movable pins 1, which are formed such that the movable pins 1 project into respective air vents 7c, and return pins 7f, which separate the upper mold 7 from the lower mold 8 at the time of releasing the mold 6 after resin filling. As shown in FIG. 1, respective movable pins 1 are connected to movable pin driving springs 2 such that the movable pins 1 are capable of applying a load of approximately 9.8 Newton to 49 Newton (1–5 kg) to the multi-cavity board 40 and are formed such that the movable pins 1 project respectively into the air vents 7c.

Figure 3:
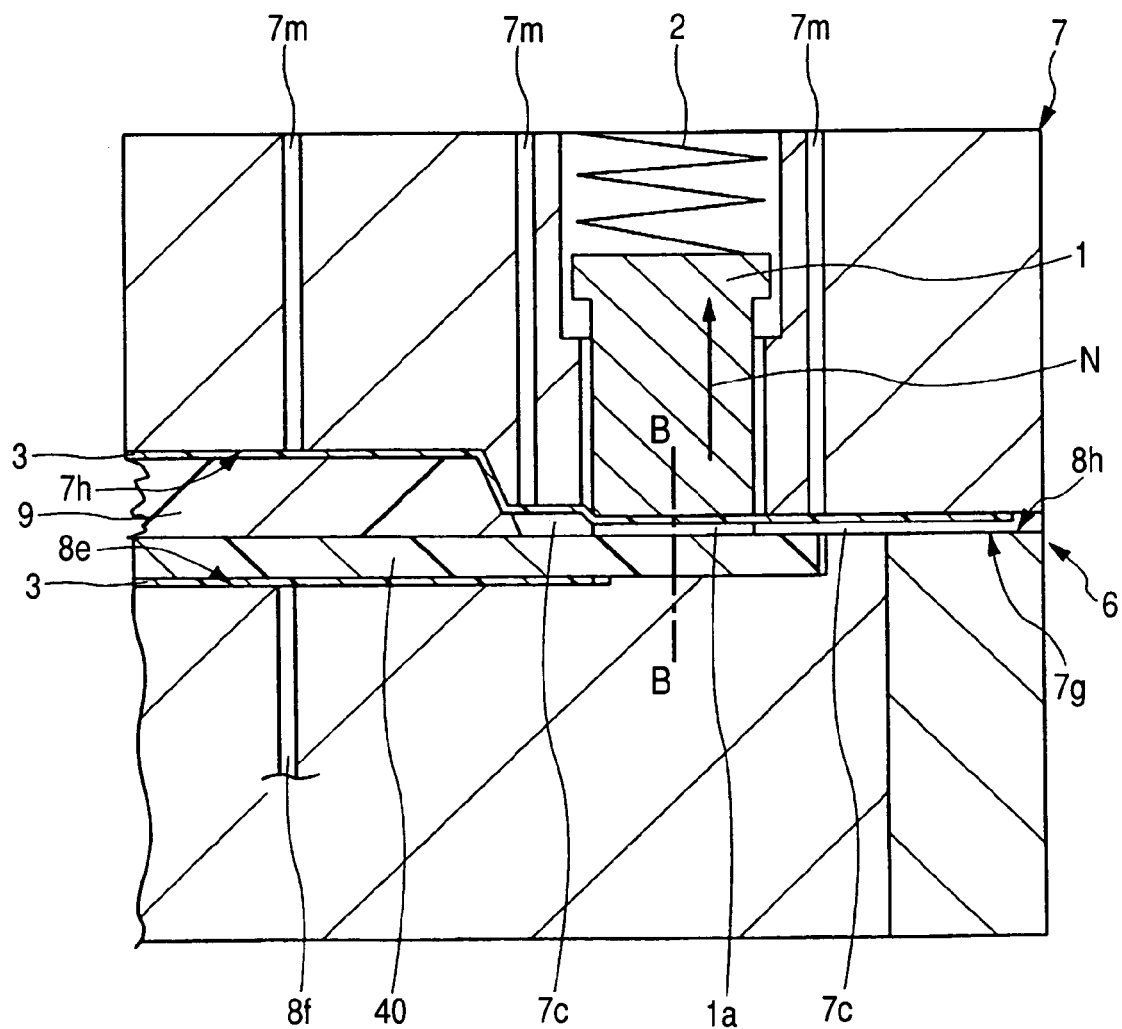
FIG. 3 is a cross-sectional view of an enlarged portion showing one example of the structure of air vents at the time of filling resin in the inside of the mold shown in FIG. 1.

The mold according to this embodiment 1 includes the plural air vents 7c, and it is capable of performing resin molding by filling sealing resin 9, as shown in FIG. 3, while setting the depths of respective air vents 7c to a fixed value irrespective of the board thickness and the state of the board surface, such as an unevenness at the time of resin molding.

Figure 11:
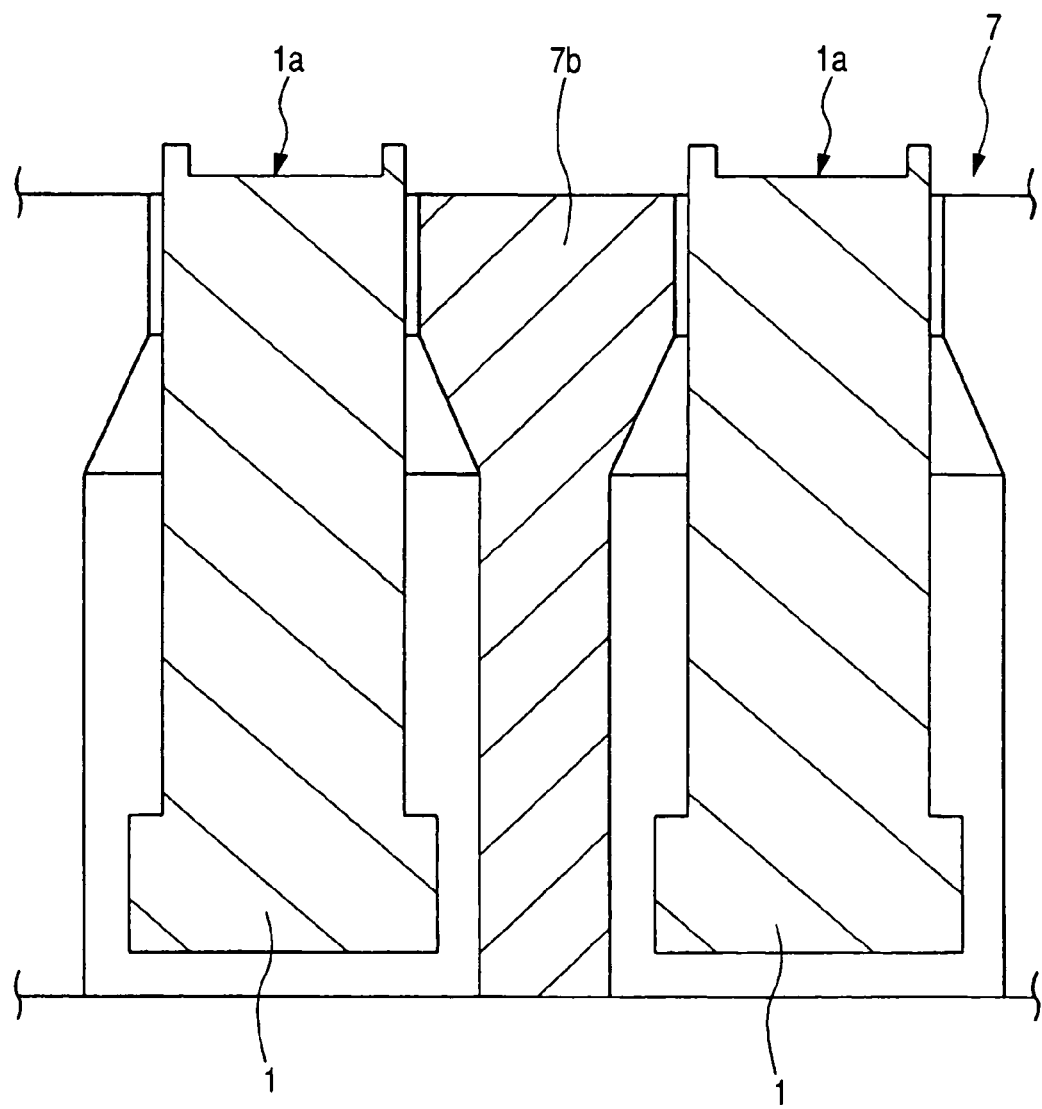
FIG. 11 is an enlarged partial cross-sectional view showing the structure of a cross section taken along a line E—E in FIG. 10.

Accordingly, the movable pins 1 which have the distal ends thereof respectively projected into the air vents 7c corresponding to respective air vents 7c are formed, and grooves 1a which constitute air passages, as shown in FIG. 11, are formed in distal ends of respective movable pins 1.

Further, the movable pins 1 are connected with the movable pin driving springs 2 in the inside of the upper mold 7 such that the load, which is far smaller compared with the clamping force of the mold 6 and is set at a level which does not deform or damage the board, is applied to the multi-cavity printed wiring circuit board 40 at the time of clamping the mold, as shown in FIG. 3. Here, the clamping force of the mold 6 is, for example, 150,000 Newton or approximately 15,000 kg-weight per one board in a display unit of a general-purpose device, wherein a portion of the board where the clamping force acts is an annular region having a width of approximately 1 mm around an outer portion of the mold cavity. Taking a rectangular collective mold board having a size of 151 mm×66 mm as an example, the annular region has a size of 148 mm×60 mm, a width of 0.8 mm and an area of 352 mm$^2$. Further, the load which is far smaller compared with the clamping force of the mold frame 6 and does not deform or damage the board is, for example, 9.8 Newton to 49 Newton and is approximately 1–5 kg-weight in a display of a general-purpose device (indicating a value per one movable pin). Taking the movable pin 1 having a diameter of 6 mm as an example, a portion over which this force acts is a cylindrical cross-sectional area which is approximately 28 mm$^2$.

This is because, in the structure of the mold 6 according to the embodiment 1, the resin injection pressure is not directly applied to the respective air vents 7c, and, hence, as the spring force applied to the movable pins 1, the load at a level which allows the movable pins 1 to slightly push the board is sufficient. Accordingly, only the load of approximately 9.8 Newton to 49 Newton (1–5 kg) is applied to the movable pins 1 using the movable pin driving springs 2.

Further, the movable pins 1 are formed such that the amount of movement thereof in the vertical direction (N indicated in FIG. 3 and FIG. 9) becomes 100–200 μm, for example.

Due to such a constitution, even when there exists irregularities with respect to the thickness of the board or an unevenness is formed attributed to wiring or the like on the surface of the board depending on the positions of the board, at the time of clamping the molds, the distal ends of respective movable pins 1 which project into the air vents 7c at respective board positions automatically correspond to the board condition at respective board positions so that the distal ends of respective movable pins 1 are brought into close contact with the board.

Here, even when the stop positions of respective movable pins 1 in the vertical direction differ depending on the irregularities of the thickness of the board and the condition of the board surface, such as an unevenness, provided that the depths of the grooves 1a formed in the distal ends of respective movable pins 1 are set to a fixed value, it is possible to set the depths for respective air vents 7c to a fixed value, and, hence, the sealing resin 9 can be filled by automatically setting the depths of respective air vents 7c to a fixed value.

Here, the depths of the air vents 7c will be further explained.

Figure 9:
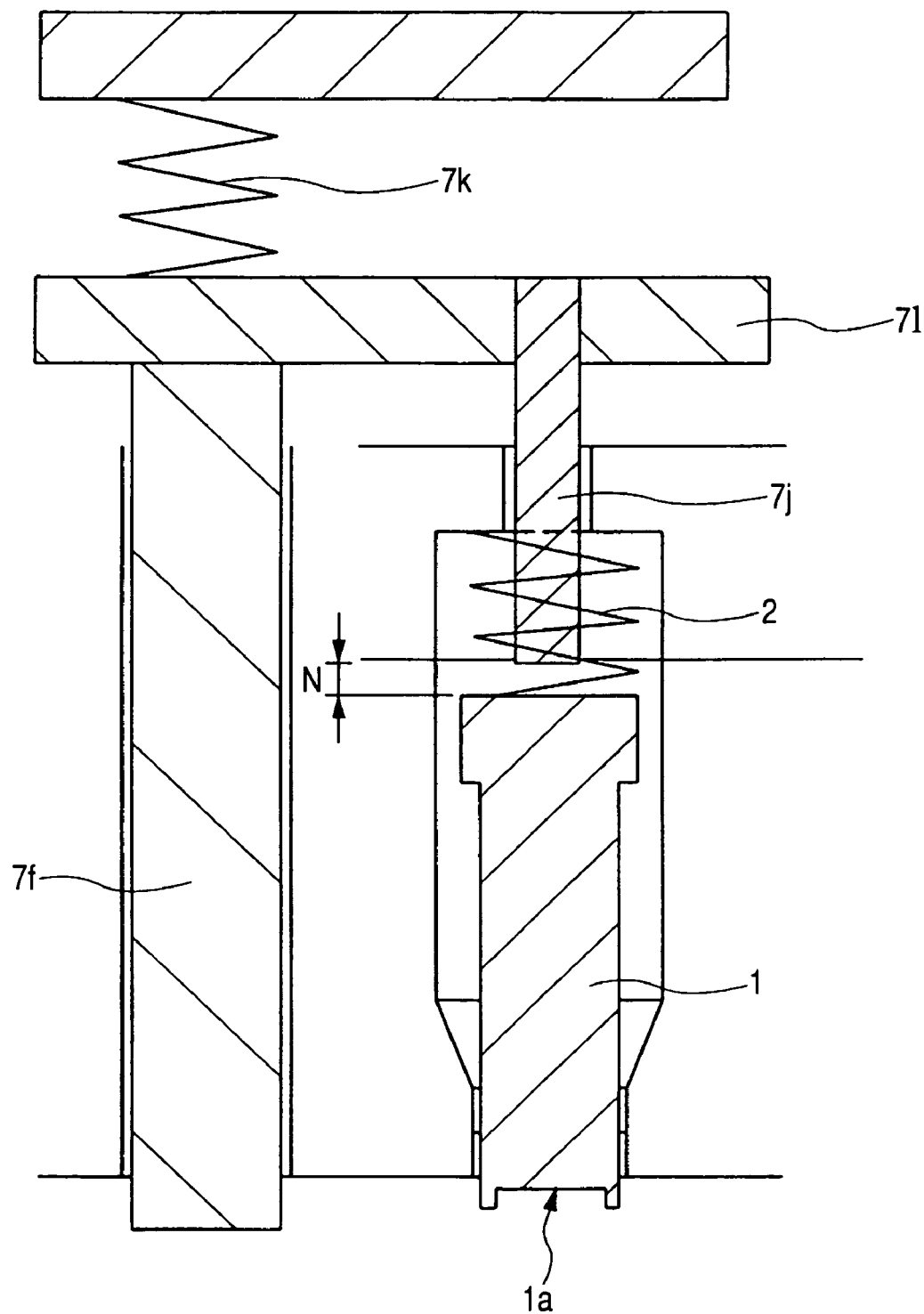
FIG. 9 is an enlarged partial cross-sectional view showing the structure of a portion C in FIG. 5.

The air vent 7c can be classified into four portions consisting of a movable-pin front portion, a movable-pin portion (or an air vent main portion), a movable-pin rear portion and a release portion, which portions are arranged in sequence in the direction from the cavity (collective cavity 7h) to a flow passage. To explain the movable-pin front portion, assuming that the tolerance of the thickness of the resin board is approximately ±30 μm, for example, even when the board has the largest thickness, by setting the depth of the air vent 7c to approximately 60 to 70 μm, an effective air vent depth of approximately 30 to 40 μm can be ensured. In this case, when the film 3 which constitutes the sheet is applied, the depth is not measured from the upper mold surface, but is measured from the lower surface of the sheet, as shown in FIG. 9. When there is no sheet, it is needless to say that the depth is measured from the surface of the upper mold. Accordingly, assuming that the usual thickness of the sheet is 50 μm, it is estimated that the actual thickness of the sheet becomes approximately 30 μm as a result of elongation at the time of molding the sheet, and, hence, the depth of mechanical cuts for the air vents becomes the above-mentioned value+the actual thickness of the sheet in performing the sheet molding. By setting the depth of cuts to approximately 40 to 50 μm at the movable pin portion, the value can be automatically ensured. It is sufficient to set the depth of the cuts to approximately 50 to 60 μm at the movable-pin rear portion. This is because the movable-pin rear portion is immediately connected with the releasing portion having a depth of approximately 150 μm.

By setting the effective depth of the main portion of the air vents 7c to a fixed value irrespective of the thickness of the printed wiring circuit board or the like (including the lead frame) in the above-mentioned manner, it is possible to effectively prevent leaking of resin without excessively increasing the clamping force (for example, in the above-mentioned example, a clamping force having up to 5000 kg-weight per one board can excessively deform the board).

Further, when the tolerance of the thickness of the board is slightly set in the minus direction, a leaking of the resin is liable to easily occur. In the mold 6 according to the embodiment 1, since the movable pin 1 projects beyond the mold surface 7g, the movable pin functions as a plug and leaking of the sealing resin 9 (leaking of resin) is prevented.

In the mold 6 according to the embodiment 1, as shown in FIG. 1, the depth differs between the depth (L) of the cavity side (movable pin front portion) of the movable pin 1 in the air vent 7c and the depth (M) of the outside (movable-pin rear portion) of the movable pin 1, wherein the depth (L) of the cavity side of the movable pin 1 is set to be greater than the depth (M) of the outside of the movable pin 1. For example, it is preferable to set the depth L to approximately 60 to 70 μm and the depth M to approximately 50 to 60 μm.

Due to such a constitution, even when a deformation, such as a warp, occurs in the vicinity of a path leading from the gate 7i to the cavity on the board, there is no possibility that the air vent 7c in the vicinity of the gate 7i will be clogged by the board, and, hence, the air vent 7c in the vicinity of the gate 7i can be reliably ensured.

Next, the width of the air vent 7c will be explained.

Figure 10:
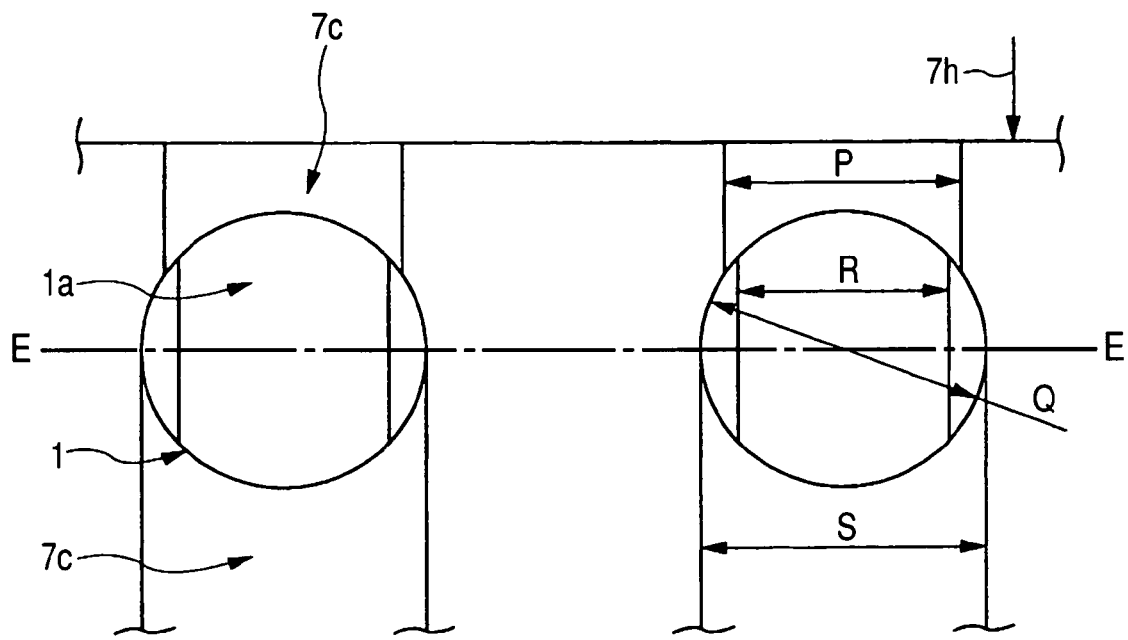
FIG. 10 is an enlarged partial plan view showing the structure of a portion D in FIG. 5.

In the mold 6 according to this embodiment 1, as shown in FIG. 10, the vent width (P) of the air vent 7c at the cavity side of the movable pin 1 is set to be smaller than the pin diameter (Q) of the movable pin 1. In other words, the pin diameter (Q) of the movable pin 1 is set to be larger than the vent width (P) of the air vent 7c at the cavity side of the movable pin 1.

For example, assuming that the pin diameter (Q) of the movable pin 1 is 5 mm, it is preferable to set the vent width (P) of the air vent 7c at the cavity side to approximately 4 mm and the vent width (S) of the air vent 7c at the outside of the movable pin 1 to approximately 5 mm, and the width (R) of the groove 1a of a distal end of the movable pin 1 to 2 to 3 mm.

Accordingly, the movable pins 1 function as plugs and stop any leaking of resin which occurs when the tolerance of the thickness of the board is slightly set in the minus direction, and, hence, leaking of the sealing resin 9 (leaking of resin) can be surely prevented.

In the mold 6 of this embodiment 1, movable-pin rammers (pusher rods) 7j, as shown in FIG. 9, which makes the movable pins 1 project to the air vent side when the mold 6 is released, are formed over the upper mold 7. Due to such a constitution, when the mold 6 is released, it is possible to further push the movable pins 1 so as to make the movable pins 1 project into the air vent side with the use of the movable-pin rammers 7j.

The movable-pin rammers 7j are configured such that the movable-pin rammers 7j are held by a rammer holder 71, and the rammer holder 71 is capable of pushing the movable-pin rammers 7j in response to the spring force of a movable-pin pushup spring 7k. Due to such a constitution, by pushing out the movable pins 1 to the air vent side with the use of the movable-pin rammers 7j at the time of releasing the mold 6, even when the sealing resin 9 intrudes at the peripheries of the movable pins 1, it is possible to prevent the operation of the movable pins 1 from being worsened, and, hence, it is possible to ensure a sufficient maintenance of the operation of the movable pins 1.

Further, in the mold 6 according to the embodiment 1, the resin molding is performed over the board, and, hence, a plurality of suction holes 7m, 8f are formed in the upper mold 7 and the lower mold 8, respectively, such that upper and lower films 3 (sheets) are sucked and brought into close contact with the mold surfaces 7g, 8h at the time of performing resin molding. These films 3 are used for preventing the adhesion of resin to the wiring over the board and damage to the wiring at the time of clamping the molds. By arranging the films 3 respectively on the mold surface 7g of the upper mold 7 and the mold surface 8h of the lower mold 8 at the time of resin molding, by suction applied to the respective films 3 through the suction holes 7m, 8f and by heating the mold 6 at a given temperature (for example, approximately 180° C.), the films 3 are brought into close contact with the respective mold surfaces 7g, 8h and, thereafter, the resin is filled.

Figure 2:
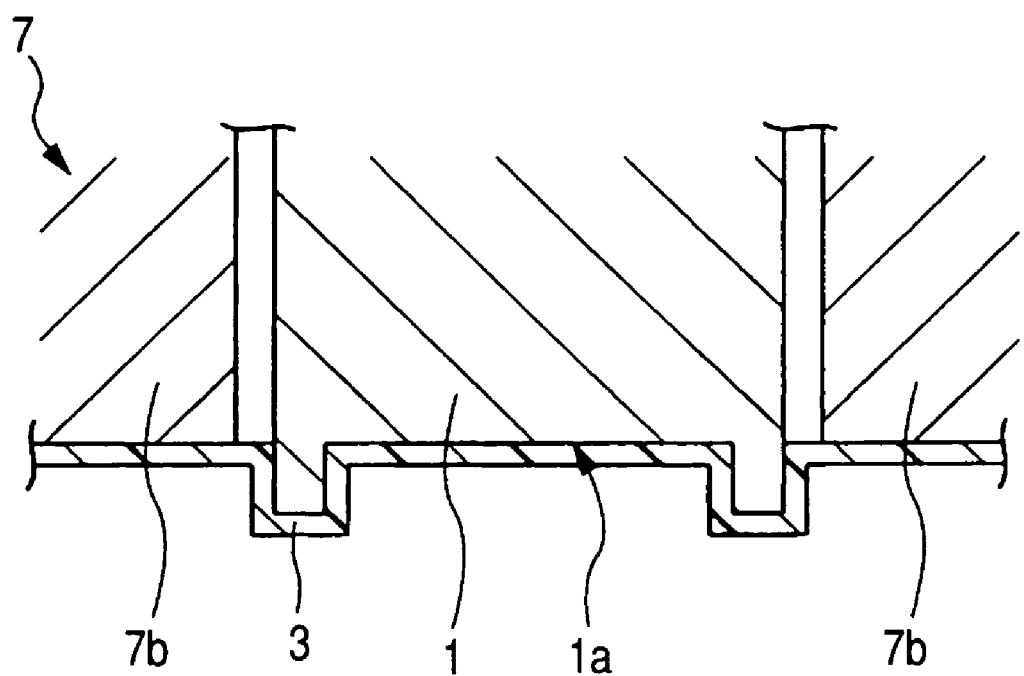
FIG. 2 is an enlarged partial cross-sectional view showing the structure of a cross section taken along a line A—A in FIG. 1.
Figure 4:
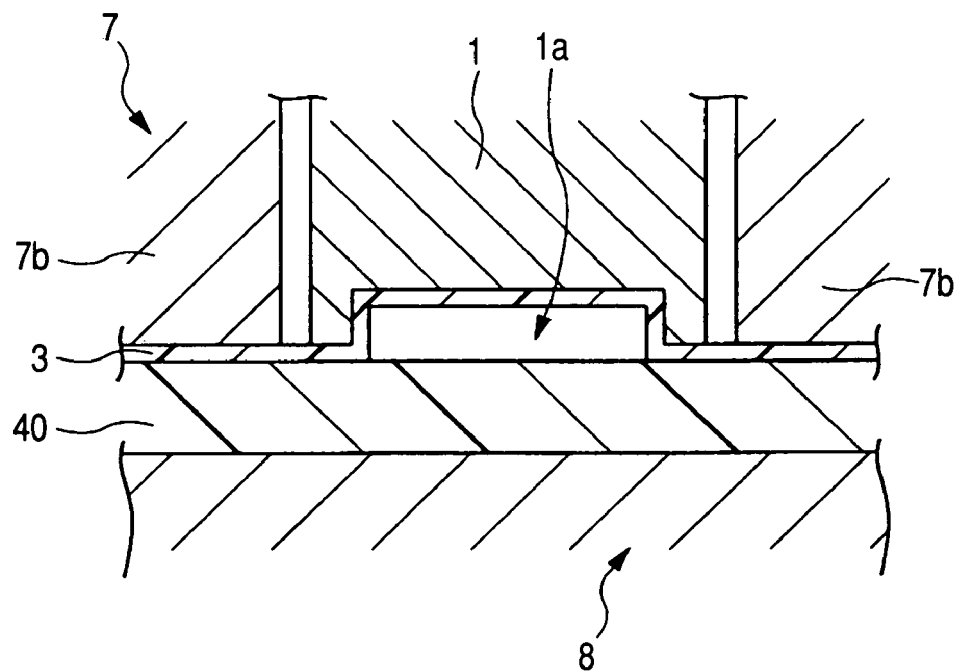
FIG. 4 is an enlarged partial cross-sectional view showing the structure of a cross section taken along a line B—B in FIG. 3.

Here, as shown in FIG. 1, the suction holes 7m are formed in the upper frame 7 in the vicinity of the movable pins 1. By applying suction to the film 3 through the suction holes 7m before clamping the mold and also by heating the mold 6 to a given temperature so as to bring the film 3 into close contact with the mold surface 7g, as shown in FIG. 2, it is possible to bring the film 3 into contact with the grooves 1a formed in the distal ends of the movable pins 1, such that the film 3 follows the contour of the grooves 1a. Accordingly, even when the film 3 is arranged on the mold surface 7g, it is possible to form the grooves 1a in the distal ends of the movable pins 1 at the time of clamping the molds, as shown in FIG. 4.

Here, the films 3 which are used for resin molding are, for example, formed of a thin film, such as a fluorine-based film material which has a thickness of approximately 50 μm and is extremely flexible.

Figure 7:
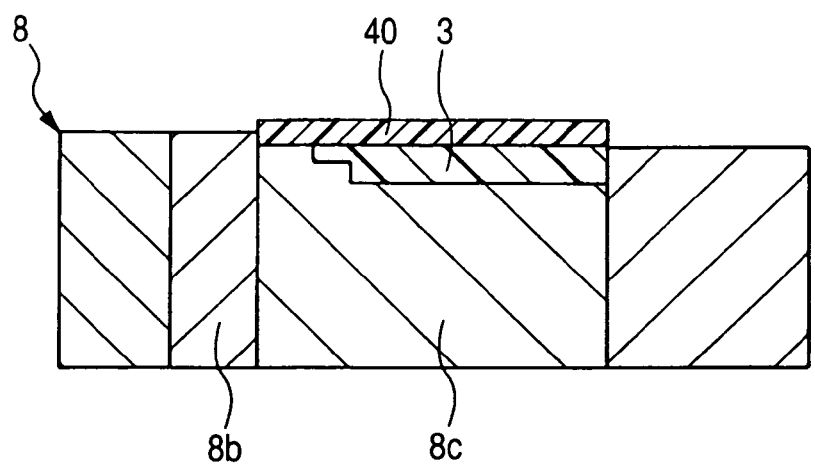
FIG. 7 is a partial cross-sectional view showing one example of the structure of a lower mold of the mold shown in FIG. 1.
Figure 16:
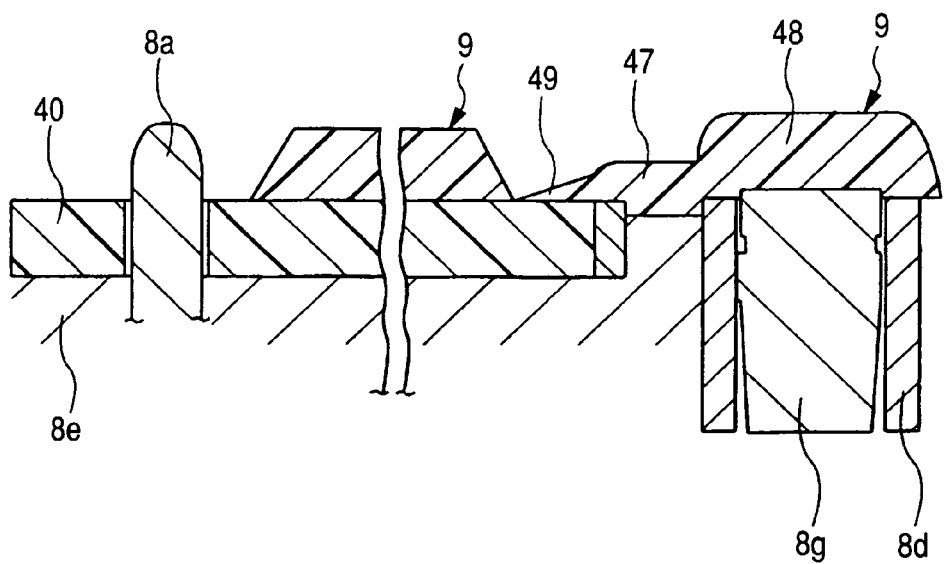
FIG. 16 is an enlarged cross-sectional view showing one example of the relationship between the printed wiring circuit board and guide pins at the time of resin molding in the method of fabrication of a semiconductor integrated circuit device according to embodiment 1 of the present invention.

On the other hand, the lower mold 8 of the mold 6 is, as shown in FIG. 7, mainly constituted of pot holders 8b and a cavity block 8c, wherein a plurality of pots 8d are formed in the pot holder 8b corresponding to the plural culls 7d formed in the upper mold 7. Plungers 8g, as shown in FIG. 16, which push out the sealing resin 9, are arranged in the respective pots 8d.

Figure 8:
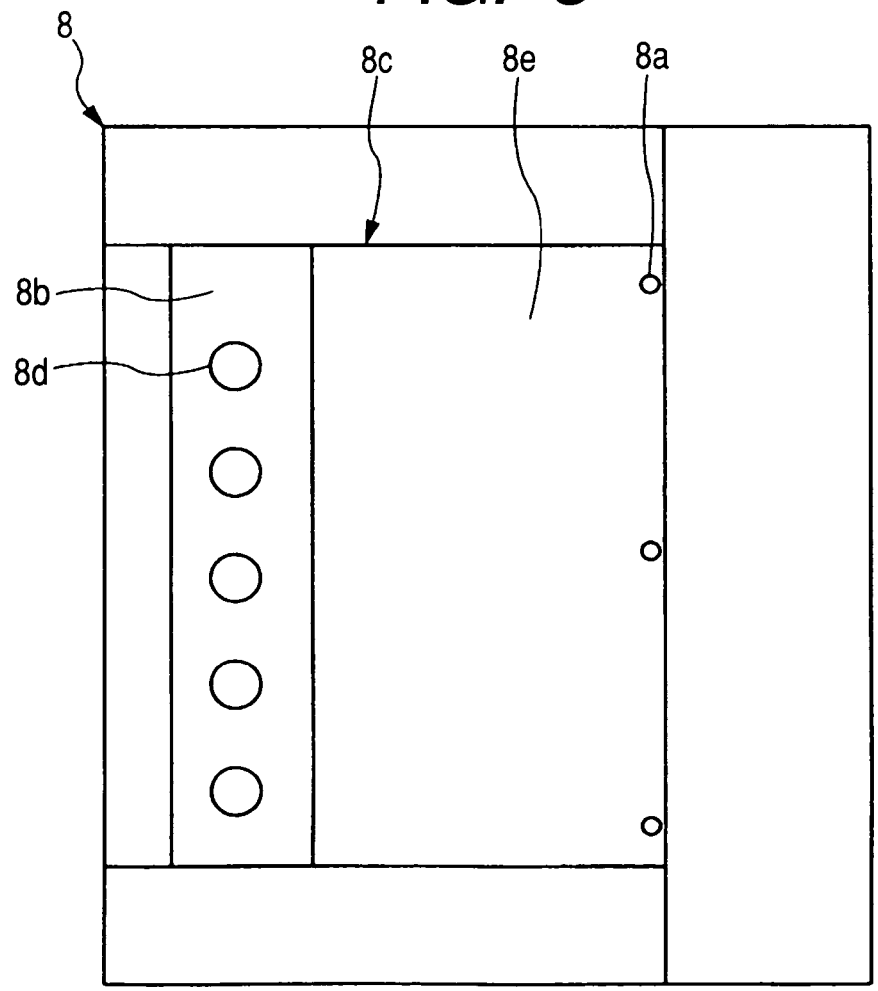
FIG. 8 is a plan view showing one example of the structure of a mold surface of the lower mold shown in FIG. 7.

Further, in the cavity block 8c of the lower mold 8, a lower-mold cavity 8e is formed, as shown in FIG. 8, while guide pins 8a, which guide the board, such as the multi-cavity board 40 arranged on the mold surface 8h, are mounted on the cavity block 8c.

Figure 12:
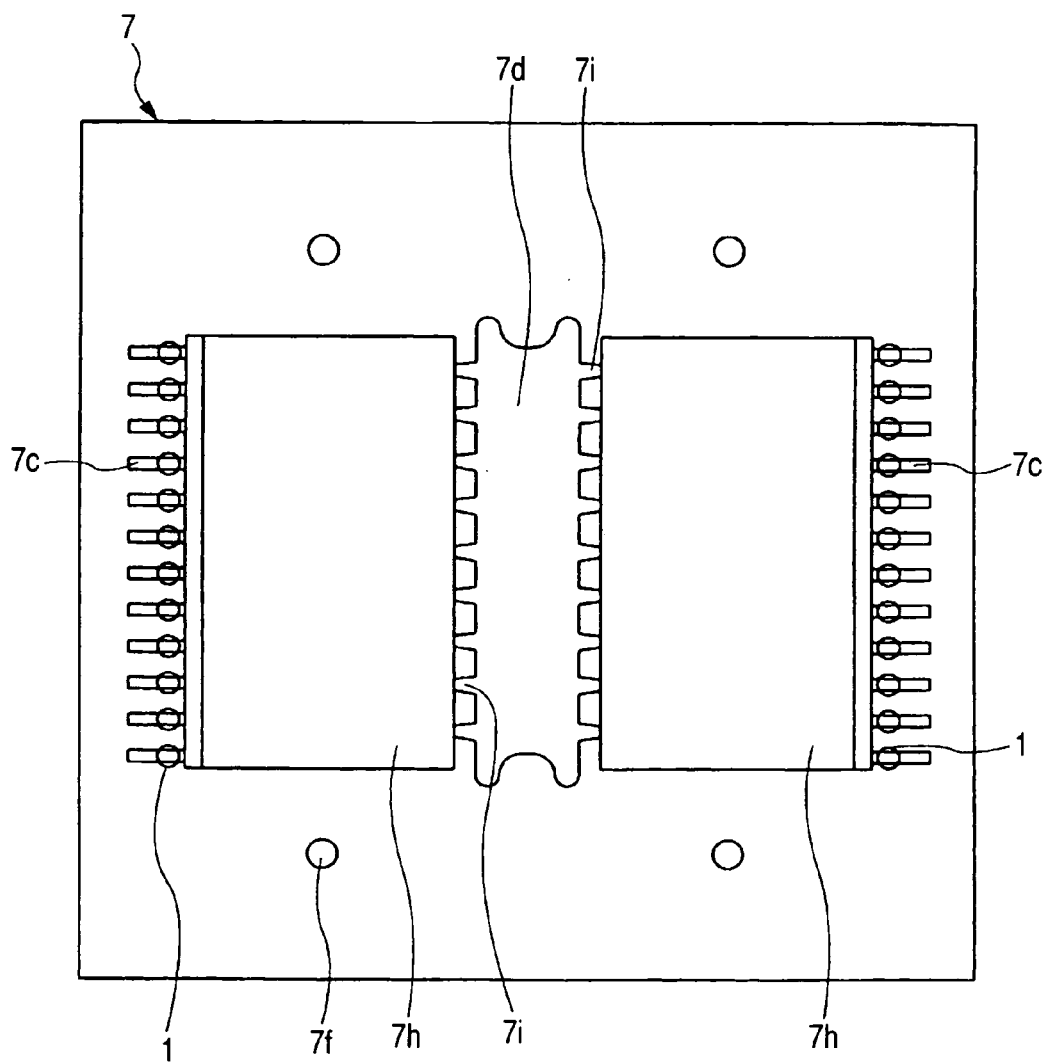
FIG. 12 is a plan view showing one example of the structure of the upper mold of a mold for collective molding used in the method of fabrication of a semiconductor integrated circuit device according to an embodiment 1 of the present invention.

Here, FIG. 12 shows an upper mold 7 which is capable of resin-molding two sheets of multi-cavity boards 40 at one time, wherein collective cavities 7h for arranging two sheets of multi-cavity boards 40 are respectively formed at both sides of a collective sealing cull 7d, while a plurality of air vents 7c are formed in parallel at sides of the collective cavities 7h opposite to the cull 7d. Each air vent 7c has a structure which allows the air vent 7c to communicate with the collective cavity 7h so as to release air at the time of resin filling. Further, in each air vent 7c, the movable pin 1 is arranged in a projected manner.

Figure 13:
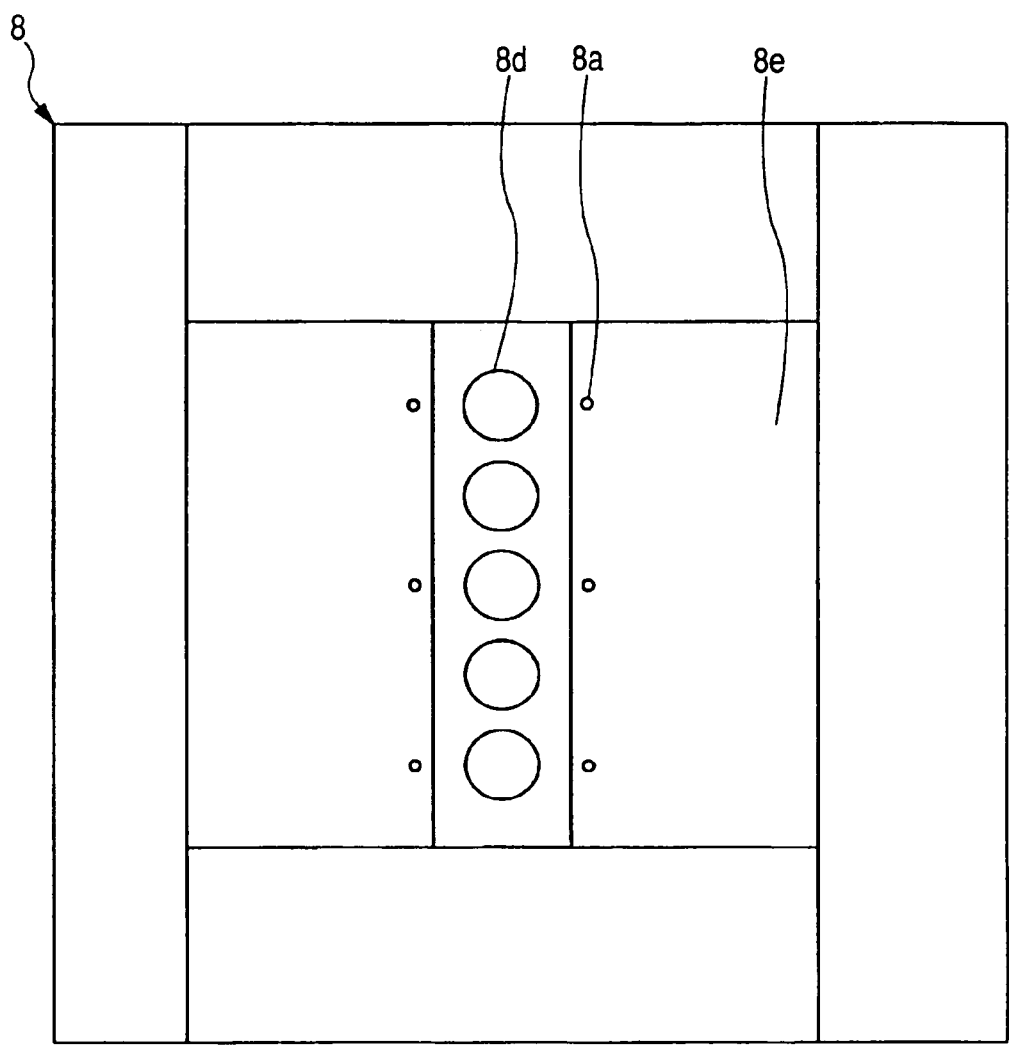
FIG. 13 is a plan view showing one example of the structure of the lower mold which constitutes a pair together with the upper mold shown in FIG. 12.

Further, FIG. 13 shows the structure of the lower mold 8 which forms a pair with the upper mold 7 shown in FIG. 12.

Next, the method fabrication of the semiconductor integrated circuit device (CSP 43) of the embodiment 1 will be explained.

First of all, the multi-cavity board 40 shown in FIG. 15, is prepared, over which a plurality of device areas 40c are formed in a matrix array, each of which has the chip mounting area 40b including a chip mounting portion and a plurality of leads 41c (see FIG. 14).

Thereafter, on the chip mounting areas 40b of the device areas 40c of the main surface 40a of the multi-cavity board 40, semiconductor chips 4 are mounted by means of an adhesive or the like. Since the CSP 43 of the embodiment 1 is of a chip stacking type, here, firstly, the semiconductor chips 4 at the lower stage are mounted on the chip mounting areas 40b of the respective device areas 40c, and, subsequently, the semiconductor chips 4 at the upper stage are mounted on the semiconductor chips 4 of the lower stage.

After the mounting of the chips by stacking is completed, wire bonding is performed. That is, the bonding electrodes 4b of the semiconductor chips 4 at the lower stage and the lead 41c corresponding to the bonding electrodes 4b are connected to each other by the wires 5, while the bonding electrode 4b of the semiconductor chip 4 at the upper stage and the lead 41c corresponding to the bonding electrode 4b are connected by the wires 5.

Thereafter, resin molding is performed.

First of all, the upper mold 7 and the lower mold 8 are, for example, heated to a temperature of 180 degree; and, at the same time, as shown in FIG. 1, in the upper mold 7 and the lower mold 8, respectively, by applying suction the respective upper and lower films 3 through the suction holes 7m, 8f, the respective films 3 are brought into close contact with the respective mold surfaces 7g, 8h.

Here, at the upper mold 7 side, the movable pins 1 are arranged in the respective air vents 7c in a state such that the distal ends of movable pins 1 are projected. When suction is applied to the film 3 through the sucking hole 7*m*, the film 3 follows the shape of the mold surface 7*g* as shown in FIG. 1 and is brought into close contact with the mold surface 7*g*. At the same time, the film also follows the shape of a groove 1*a* formed in the distal end of the movable pin 1 and is brought into close contact with the groove 1*a* as shown in FIG. 2. On the other hand, at the lower mold 8 side as well, the film 3 is brought into close contact with the mold surface 8*h*.

Under such a situation, the semiconductor chips 4 are mounted on the mold surface 8*h* of the lower mold 8, and, at the same time, the multi-cavity board 40 over which the wire bonding is already completed is arranged on the mold surface 8*h* of the lower mold 8. Here, the multi-cavity board 40 is positioned by the guide pins 8*a*, as shown in FIG. 16.

Further, a plurality of device areas 40*c* of the multi-cavity board 40 are collectively covered with one collective cavity 7*h* of the upper mold 7 and, thereafter, the upper mold 7 and the lower mold 8 of the mold 6 are clamped together by closing them, as shown in FIG. 3.

Here, since the movable pins 1 are projected in the respective air vents 7*c*, slightly before the upper mold 7 and the lower mold 8 are completely closed, the distal ends of the movable pins 1 are brought into contact with the main surface 40*a* of the multi-cavity board 40. Further, immediately after such a contact, the upper mold 7 and the lower mold 8 are closed. Thereafter, since a spring force is always applied to the movable pins 1 by the movable-pin driving springs 2, even after clamping the upper mold 7 and the lower mold 8 together, each movable pin 1 pushes against the multi-cavity board 40 toward the lower mold 8 side.

That is, since the spring force of the movable pin driving springs 2 is relatively small (for example, from 9.8 Newton to 49 Newton: 1–5 kg) compared with the mold clamping force (for example, 150,000 Newton: 15,000 kg), even after clamping the molds together, each movable pin 1 pushes against the multi-cavity board 40 in the direction of the mold surface 8*h* of the lower mold 8 in each air vent 7*c*. Here, since the load applied by pushing is extremely small, it is possible to prevent the multi-cavity board 40 from being deformed or damaged.

Due to such a constitution, an air passage in each air vent 7*c* is attributed to the depth and the width of the groove 1*a* formed in the distal end of the movable pin 1. Since the grooves 1*a* formed in the respective movable pins 1 have the same depth and the same width in respective air vents 7*c*, irrespective of irregularities in the thickness of the board or the surface condition of the board, such as unevenness in respective air vents 7*c*, it is possible to form the air vent structure shown in FIG. 4. As a result, the depths of respective air vents 7*c* can be set to a fixed value.

Thereafter, in a state in which the depths of respective air vents 7*c* are set to a fixed value, as shown in FIG. 16, the sealing resin 9 is pushed out by the plunger 8*g* so that the sealing resin 9 is filled in the collective cavity 7*h*, as shown in FIG. 3.

At the time of filling the resin, even when the multi-cavity board 40 is formed with a slightly larger thickness due to irregularities in thickness, the respective air vents 7*c* have a fixed depth due to the grooves 1*a* formed in the distal ends of respective movable pins 1 (the digging depths of the movable pin portions eventually determining the depths of the air vent movable pin portions; in sheet molding, a value obtained by subtracting an actual thickness from the digging depths of the movable pin portions determining the depths of the air vent movable pin portions); and, hence, it is possible to ensure leakage of the air from the collective cavity 7*h*, whereby the occurrence of a state in which the sealing resin 9 is not sufficiently filled (a resin unfilled state) can be prevented.

Further, even when the multi-cavity board 40 is formed with a slightly smaller thickness due to irregularities in thickness, the respective air vents 7*c* have a fixed depth due to the grooves 1*a* formed in the distal ends of respective movable pins 1 in the same manner; and, hence, the occurrence of any leaking of the resin and the occurrence of a welding defect, which is a defect attributed to voids in a surface of the sealing body, can be obviated.

Accordingly, the occurrence of defects can be reduced, and, hence, the yield rate of the products can be enhanced.

Especially, when the multi-cavity board 40 is a board which is formed of resin, unevenness attributed to warping of the board or the presence or non-presence of wiring is liable to easily occur. In the mold 6 according to the embodiment 1, the depths of respective air vents 7*c* can be set to a fixed value irrespective of the conditions of the surface of the board.

Further, the occurrence of the defects can be reduced and the yield rate can be enhanced in the above-mentioned manner, so that, in an appearance inspection carried out after completion of the resin sealing operation, the inspection flow becomes smooth, and, hence, the throughput of the appearance inspection can be enhanced.

Further, the occurrence of any leaking of the resin can be prevented in the air vents 7*c*, and, hence, the occurrence of adhesion of resin to the main surface 40*a* of the multi-cavity board 40 outside an allowable range can be prevented.

Accordingly, in the succeeding process after completion of resin sealing, for example, when the multi-cavity board 40 is arranged at a chute of a dicer (a board transfer jig), it is possible to prevent the occurrence of drawbacks, for example, where the board cannot be placed in the chute because resin, which adheres to an outer peripheral portion or the like of the board due to leaking of the resin, is caught.

Further, the mold 6 according to this embodiment 1 adopts the structure in which the depths of respective air vents 7*c* are automatically set to a fixed value due to the movable pins 1 mounted on the upper mold 7 at the time of clamping the molds, as a mold clamping force, it is sufficient to set a load which is slightly larger than the resin injection pressure irrespective of the structure of the lower mold 8. As a result, the mold clamping force can be reduced compared with the mold clamping force for the conventional mold.

Since the mold clamping force can be reduced in this manner, a load applied to the board at the time of clamping the mold can be reduced, whereby the occurrence of drawbacks, such as the formation of cracks in the board or the deformation of the board can be prevented.

Further, since this embodiment adopts a he mold structure in which the depths of respective air vents 7*c* can be set to a fixed value due to the movable pins 1 which are mounted on the upper mold 7 irrespective of the thickness of the board, the allowable range (tolerance) of the thickness of the board, such as the multi-cavity board 40 or the like, can be broadened. Accordingly, the fabrication cost of the board can be reduced, and, hence, the fabrication cost of the semiconductor integrated circuit device, such as CSP 43 or the like, can be reduced.

When the resin sealing is finished and the mold 6 is opened, the multi-cavity board 40 which is sealed by resin is taken out from the mold 6.

Figure 17:
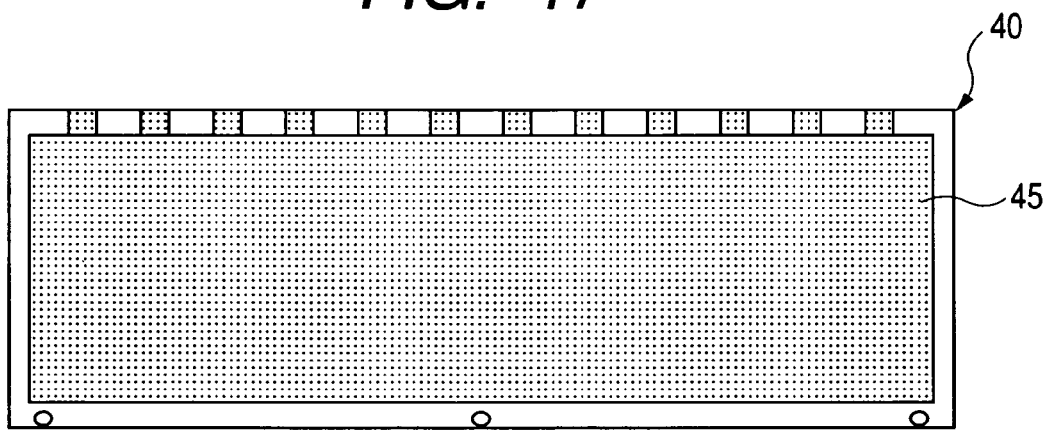
FIG. 17 is a plan view showing one example of the printed wiring circuit board structure after resin molding in the method of fabrication of a semiconductor integrated circuit device according to embodiment 1 of the present invention.
Figure 19:
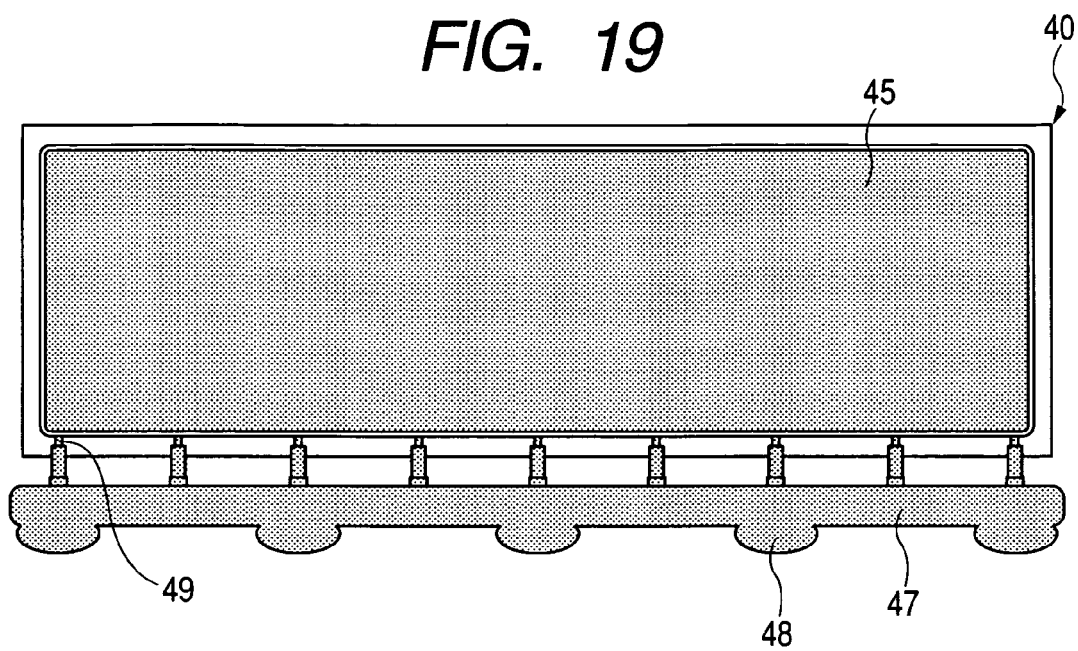
FIG. 19 is a plan view showing one example of the structure of runners and culls after resin molding in the method of fabrication of a semiconductor integrated circuit device according to embodiment 1 of the present invention.

Here, on the main surface 40*a* of the multi-cavity board 40, as shown in FIG. 19, the collective sealing portion 45, which is formed by the collective molding, is formed, and, at the same time, runner resins 47, cull resin 48, gate resin 49 and the like are formed. Thereafter, the runner resin 47, the cull resin 48, the gate resin 49 and the like are removed from the collective sealing portion 45 to obtain a state as shown in FIG. 17.

Figure 18:
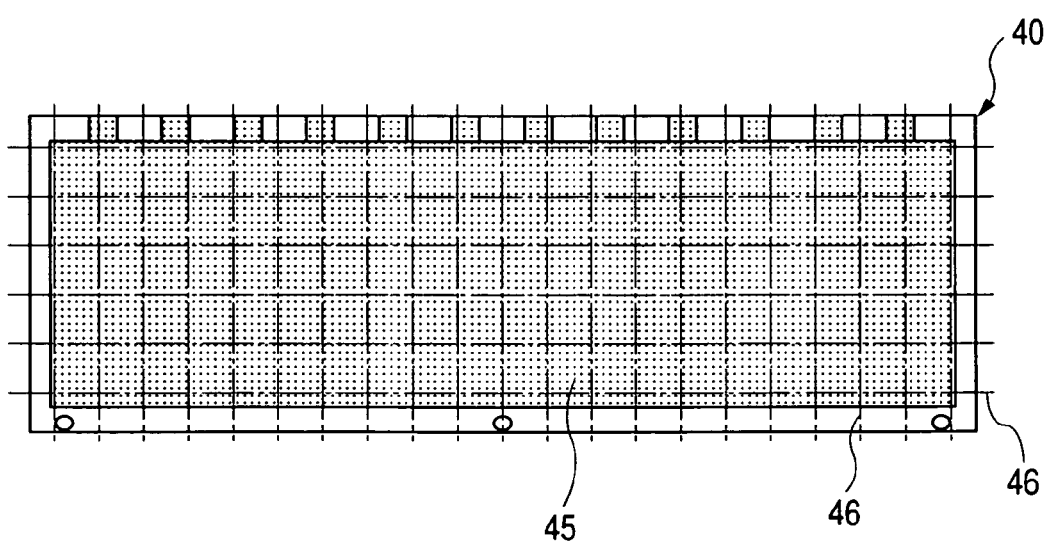
FIG. 18 is a plan view showing one example of a dicing line for dividing a wafer into pieces after resin molding in the method of fabrication of the semiconductor integrated circuit device of the embodiment 1 according to present invention.
Figure 20:
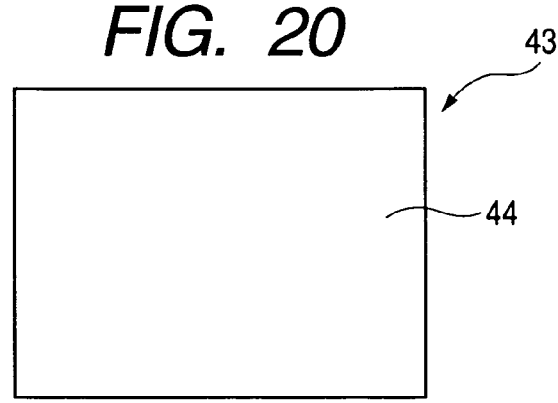
FIG. 20 is a plan view showing one example of the structure after dividing wafer into pieces in the method of fabrication of a semiconductor integrated circuit device according to embodiment 1 of the present invention.

Further, the multi-cavity board 40 is cut into individual pieces per each device area 40c. Here, the dicing is performed along dicing lines 46 shown in FIG. 18, and the multi-cavity board 40 is cut off together with the collective sealing portion 45; and, thereafter, the multi-cavity board 40 is divided into single pieces, as shown in FIG. 20.

Figure 21:
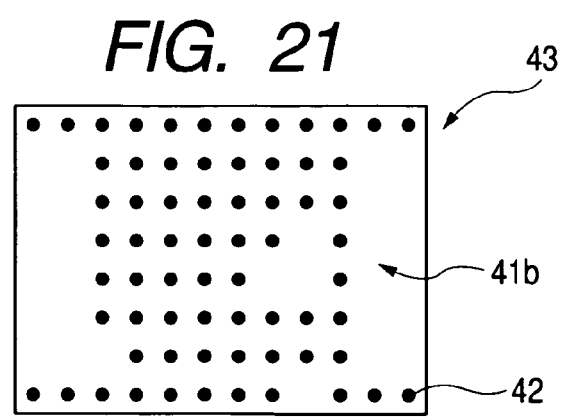
FIG. 21 is a bottom view showing one example of the structure after dividing wafer into pieces in the method of fabrication of a semiconductor integrated circuit device according to embodiment 1 of the present invention.

Thereafter, as shown in FIG. 21, the assembling of the CSP 43 is completed by mounting a plurality of solder balls 42 on the back surface 41b of the printed wiring circuit board 41, which was formed by the division of the multi-cavity board into single pieces. Here, the fixing of the solder balls 42 may be performed on the multi-cavity board 40 before the multi-cavity board 40 is divided into the single pieces by dicing.

In assembling the CSP 43 as explained above, at the time of performing the resin sealing, the film 3 (sheet) is arranged in the mold and, thereafter, the resin is filled. Therefore, the mold surface 7g of the upper mold 7 is covered with the film 3 at the time of filling the resin; and, hence, there is no possibility that the sealing resin 9 intrudes into the movable pin arranging portions connected to the air vents 7c. Accordingly, there is no possibility that the sealing resin 9 will become clogged in the above-mentioned movable pin arranging portions, and, hence, it is possible to ensure the reliable operation of the movable pins 1.

It must be noted, however, that the mold 6 according to the embodiment 1 can be used even when the resin sealing is performed without using the film 3, such as resin sealing using a board such as a lead frame. In this case, there may be a possibility that the sealing resin 9 intrudes in the above-mentioned movable pin arranging portions and the movable pins 1 are not moved due to clogged resin. However, in the mold 6 according to this embodiment 1, it is possible to forcibly push out the movable pin 1 toward the air vent side by means of the movable-pin rammer 7j at the time of opening the mold 6.

Accordingly, even when the sealing resin 9 intrudes into the periphery of the movable pin 1, the smooth operation of the movable pin 1 is maintained, and, at the same time, the maintenance of the operation of the movable pin 1 can be performed.

Further, as the mold clamping force, it is sufficient to set a load slightly larger than the resin injection pressure irrespective of the structure of the lower mold 8. As a result, the mold clamping force can be reduced compared with the mold clamping force used for the conventional mold. Since the mold clamping force can be reduced in this manner, the load applied to the board at the time of clamping the mold can be reduced, and the occurrence of drawbacks, such as the formation of cracks in the board, or the deformation of the board can be obviated.

Further, the mold 6 according to the embodiment 1 adopts a structure in which the depths of the respective air vents 7c are automatically set to a fixed value at the time of clamping the molds using the movable pins 1 mounted on the upper mold 7, and, hence, cumbersomeness, such as the preparation of input data for adjusting the opening degree adjustment means in response to the frame thickness in advance, can be avoided, and, hence, the resin sealing operation can be simplified.

Further, the mold 6 according to the embodiment 1 adopts a structure in which the depths of respective air vents 7c are automatically set to a fixed value at the time of clamping the molds due to the movable pins 1 mounted on the upper mold 7, and, hence, it is not necessary to provide a large-sized mechanism, such as a driving mechanism for opening degree adjustment means, whereby the constitution of the mold 6 can be simplified.

Accordingly, the mold 6 can be miniaturized and the cost of the mold 6 can be reduced.

Next, a modification of the embodiment 1 will be explained.

Figure 22:
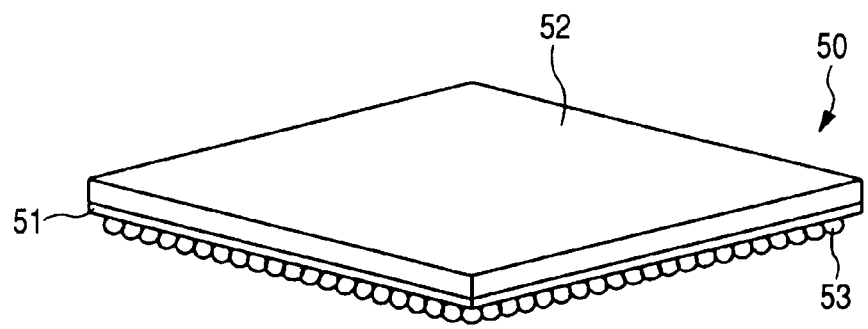
FIG. 22 is a perspective view showing the structure of a semiconductor integrated circuit device according to a modification assembled by the method of fabrication of a semiconductor integrated circuit device according to embodiment 1 of the present invention.
Figure 23:
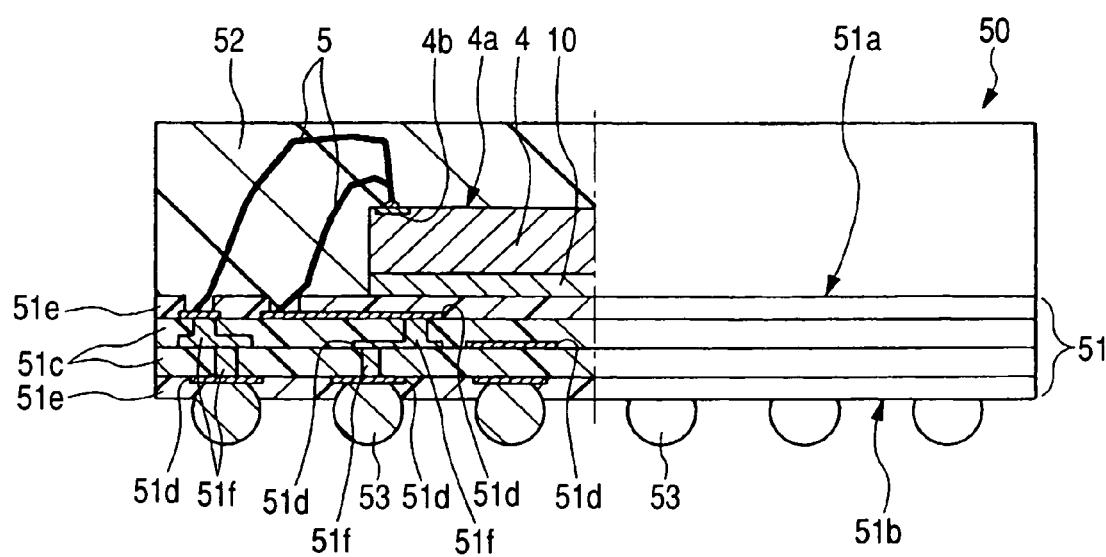
FIG. 23 is a side view showing with a part broken away of the structure of the semiconductor integrated circuit device shown in FIG. 22.

FIG. 22 shows a CSP 50, which uses a multi-layered printed wiring circuit board 51 as a board, and a portion of the inner structure of the CSP 50 is shown in FIG. 23.

The multi-layered printed wiring circuit board 51 is formed by laminating a plurality of core members 51c made of resin or the like. In the example shown in FIG. 23, two core members 51c are laminated to each other. A respective copper pattern 51d is provided to each of the three layers consisting of a main surface 51a, a back surface 51b and the inside of the board.

Here, the copper patterns 51d formed on the main surface 51a and the back surface 51b are respectively connected by through-hole wiring 51f or the like. Further, the copper patterns 51d formed on the main surface 51a and the back surface 51b are respectively covered with and insulated by a resist film 51e (insulation film) except for the connection portions, respectively.

In the CSP 50 shown in FIG. 23, a semiconductor chip 4 is mounted on the main surface 51a of the multi-layered printed wiring circuit board 51 by way of a die bonding member 10, while the bonding electrode 4b formed on the main surface 4a of the semiconductor chip 4 and the copper pattern 51d formed on the multi-layered printed wiring circuit board 51 are electrically connected by wires 5, and a plurality of solder ball 53, serving as outer terminals, are mounted on the copper pattern 51d of the back surface 51b.

Further, the semiconductor chip 4 and the plurality of wires 5 are sealed with resin to form a sealing body 52.

Figure 24:
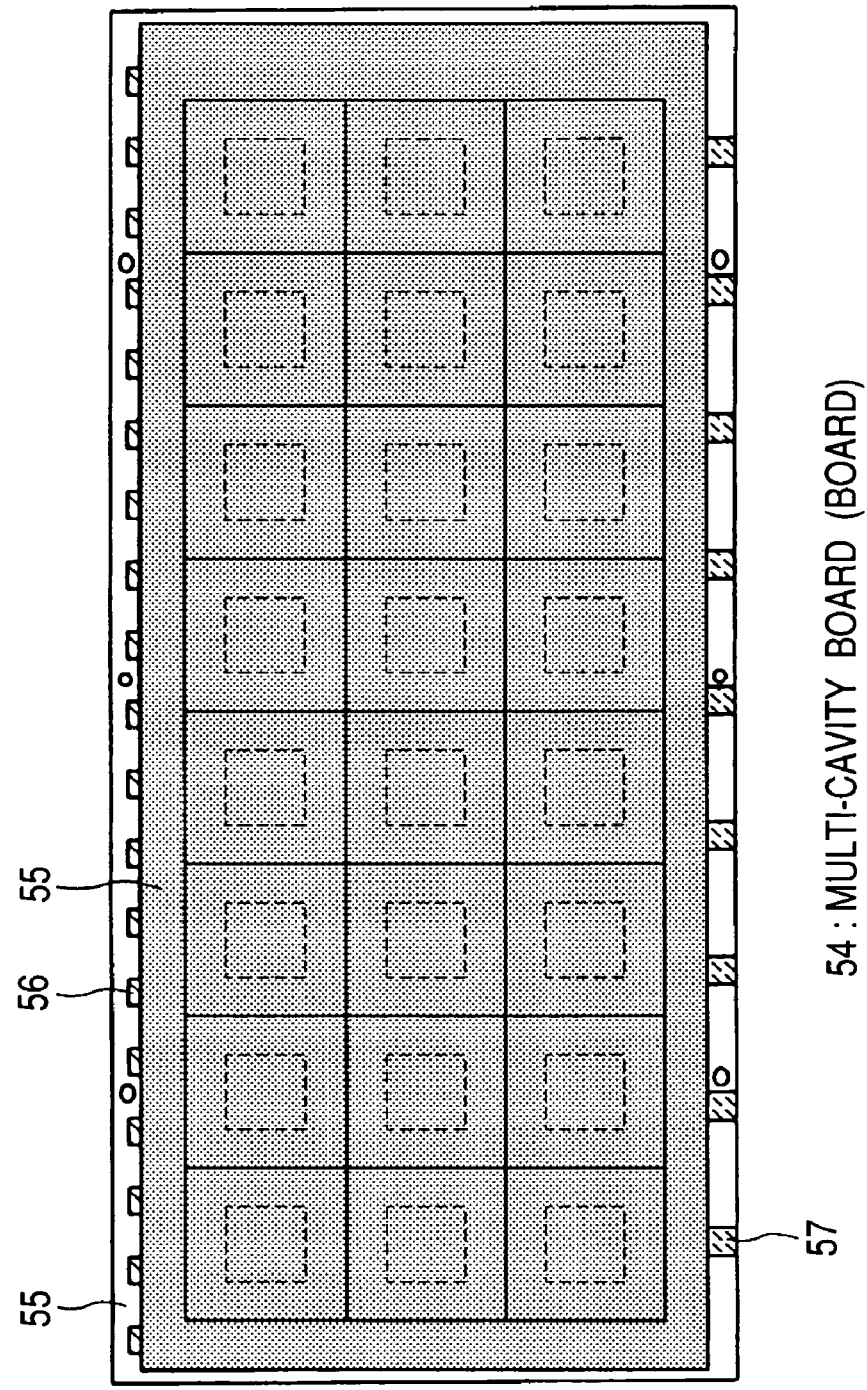
FIG. 24 is a plan view showing one example of the structure at the time of completion of resin molding in the manufacture of the semiconductor integrated circuit device shown in FIG. 22.

FIG. 24 shows the state of a multi-cavity board 54 after collective molding in the assembly of the CSP 50; and, collective sealing portion 55, air vent resin 56 and gate resin 57 are formed over the multi-cavity board 54.

Accordingly, the CSP 50 is formed such that, in the resin sealing step of the assembling operation, the collective sealing portion 55 is formed by sealing the multi-cavity board 54 having the multi-layered printed wiring structure shown in FIG. 24 with resin by collective molding, and, thereafter, the multi-cavity board 54 is divided into single pieces by dicing.

The CSP 50 also can be assembled by the above-mentioned method of fabrication of the semiconductor integrated circuit device of the embodiment 1. When the multi-cavity board 54 having the multi-layered printed wiring structure is used, the irregularities in thickness thereof are large compared with the irregularities in thickness of a board having a single layer structure. Accordingly, the method of fabrication of the semiconductor integrated circuit device of this embodiment 1, in which resin sealing can be performed by setting the depths of the air vents 7c to a fixed value irrespective of the thickness of the board, is extremely effective; and, at the same time, the cost of the multi-cavity board 54 can be reduced by alleviating the tolerance of the thickness of the multi-cavity board 54.

Further, although the CSP 43 shown in FIG. 14 or the CSP 50 shown in FIG. 22 are assembled by collective molding using the mold shown in FIG. 12 and FIG. 13, with respect to the method of fabrication of the semiconductor integrated circuit device of this embodiment 1, it is not necessary to form a new mold 6 even when the thickness of the board is changed, when the product type is changed, and, hence, the mold 6 can be used in common.

Accordingly, the fabrication cost can be reduced.

Embodiment 2

Figure 25:
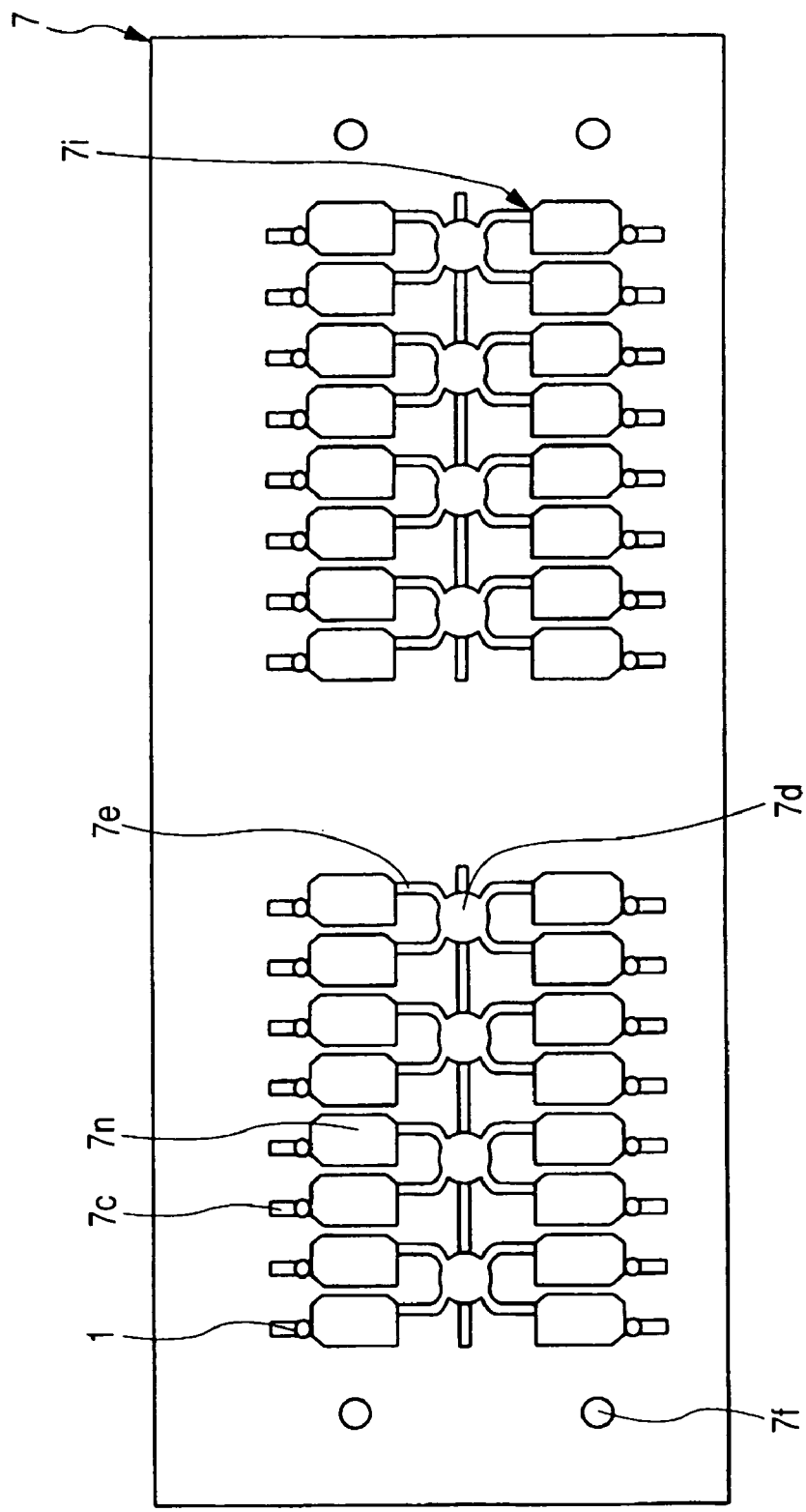
FIG. 25 is a plan view showing one example of the structure of an upper mold of a mold for simultaneously molding a plurality of semiconductor integrated circuit devices used in the method of fabrication of a semiconductor integrated circuit device according to an embodiment 2 of the present invention.
Figure 26:
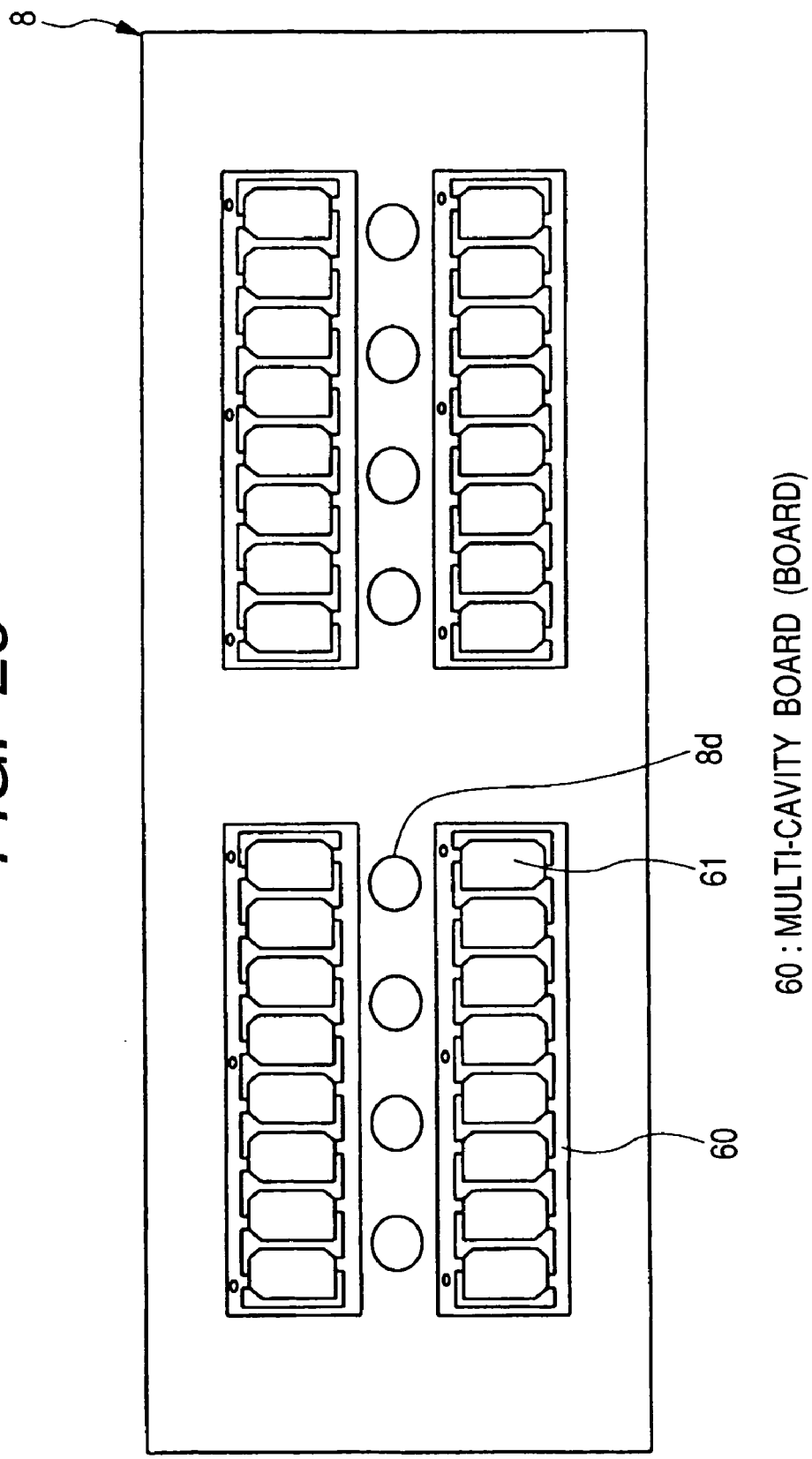
FIG. 26 is a plan view showing one example of the structure of a lower mold which constitutes a pair with the upper mold shown in FIG. 25.
Figure 27:
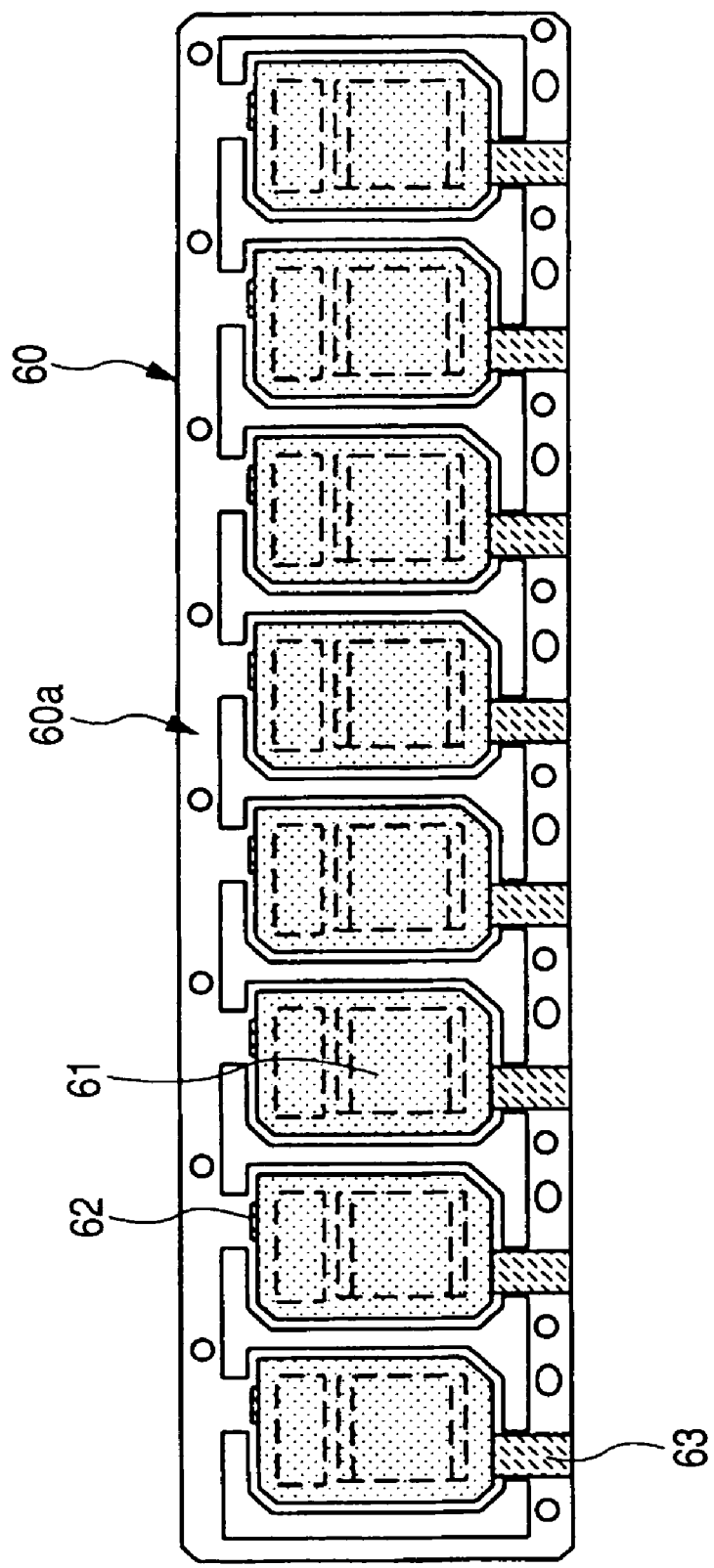
FIG. 27 is a plan view showing one example of the structure of a printed wiring circuit board after resin molding in the method of fabrication of a semiconductor integrated circuit device according to the embodiment 2 of the present invention.
Figure 28:
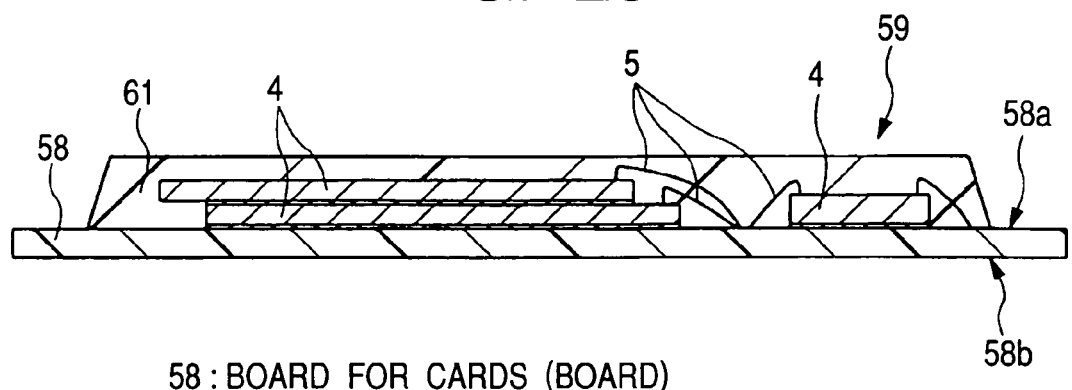
FIG. 28 is a cross-sectional view showing one example of the structure of a semiconductor integrated circuit device assembled by the method of fabrication of a semiconductor integrated circuit device according to the embodiment 2 of the present invention.
Figure 29:
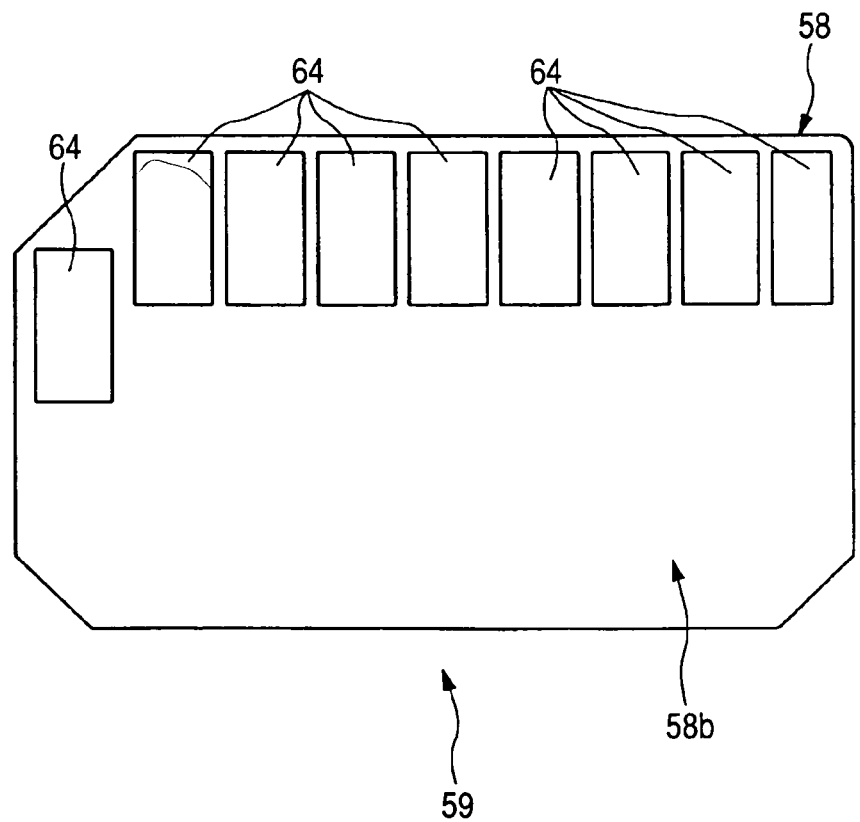
FIG. 29 is a bottom view showing one example of the structure of the semiconductor integrated circuit device shown in FIG. 28.

FIG. 25 is a plan view showing one example of the structure of an upper mold of a mold for simultaneously molding a plurality of semiconductor integrated circuit devices for use in a method of fabrication of a semiconductor integrated circuit device according to an embodiment 2 of the present invention; FIG. 26 is a plan view showing one example of the structure of a lower mold which constitutes a pair with the upper mold shown in FIG. 25; FIG. 27 is a plan view showing one example of the structure of the board after resin molding in the fabrication of the semiconductor integrated circuit device according to the embodiment 2 of the present invention; FIG. 28 is a cross-sectional view showing one example of the structure of a semiconductor integrated circuit device assembled by the method of fabrication of the semiconductor integrated circuit device according to the embodiment 2 of the present invention and FIG. 29 is a bottom view showing one example of the structure of the semiconductor integrated circuit device shown in FIG. 28.

The embodiment 2 relates to a method of fabrication of an semiconductor integrated circuit device which is assembled by using a multi-cavity board 60, wherein a plurality of the boards are arranged on one mold and these plurality of boards are sealed by resin at one time.

Here, FIG. 25 shows an upper mold 7 of the mold for simultaneously molding a plurality of boards. In this embodiment 2, four multi-cavity boards 60 can be sealed by resin at one time.

With respect to the upper mold 7 shown in FIG. 25, in individual cavities 7n which are connected to each other by way of culls 7d and runners 7e, air vents 7c are formed, respectively, at a side opposite to the runners 7e. In the same manner as the mold 6 according to the embodiment 1, movable pins 1 are mounted in respective air vents 7c. Also with respect to the mold 6 according to the embodiment 2, the movable pins 1 perform a similar movement as that of the movable pins 1 of the mold 6 according to the embodiment 1.

On the other hand, FIG. 26 shows, with respect to the lower mold 8, which forms a pair with the upper mold 7 shown in FIG. 25, a state of the lower mold 8 after arranging a plurality of multi-cavity boards 60 therein and performing resin sealing.

The multi-cavity board 60 shown in FIG. 26 is used for assembling of a card-type package (semiconductor integrated circuit device) 59, as shown in FIG. 28. The card-type package 59 has a structure in which two semiconductor chips 4 are stacked over a main surface 58a of a board for cards 58, and the card-type package 59 has a plurality of semiconductor chips 4 over which other semiconductor chips 4 are mounted close to two semiconductor chips 4, wherein any semiconductor chips 4 are connected to the board for card 58 by wire bonding.

Further, the plural semiconductor chips 4 and wires 5 are sealed by resin by a sealing body 61, and a plurality of terminals for external connections 64 are formed over a back surface 58b of the board for card 58, as shown in FIG. 29.

Further, FIG. 27 shows a state of the multi-cavity board 60 after performing resin molding in the assembling of the card type package 59, wherein a sealing portion 61, air vent resin 62 and gate resin 63 of respective packages are formed over the main surface 60a of the multi-cavity board 60.

Here, also with respect to the assembling of the card type package 59 of the embodiment 2, the resin sealing can be performed in substantially the same manner as the resin sealing method of the embodiment 1. That is, four multi-cavity boards 60 are arranged over the mold surface 8h of the lower mold 8 of the mold 6, and, thereafter, the mold 6 is clamped and resin sealing is performed. Here, the resin sealing can be performed by setting the depths of the air vents 7c to a fixed value irrespective of the thickness of the multi-cavity board 60.

Accordingly, with the use of the method of fabrication of the semiconductor integrated circuit device of the embodiment 2, it is possible to obtain substantially the same advantageous effects as the advantageous effects of the embodiment 1.

Further, with the use of the movable pins 1, which are arranged in respective air vents 7c, the resin sealing is performed by setting the depths of respective air vents 7c to a fixed value irrespective of the thickness of the multi-cavity board 60. Accordingly, even when a plurality of boards are sealed with resin using one mold 6 at a time in the same manner as the embodiment 2, without being affected by the irregularities of the thickness among the boards, the irregularities are absorbed by the mold 6, whereby the constitution is very effective.

For example, if only one of four multi-cavity boards 60 is formed rather thick, conventionally, a leaking of resin occurs with respect to the other three molds when the resin sealing is performed at the time. However, the resin sealing in assembling of the semiconductor integrated circuit device according to the embodiment 2 is not affected by the irregularities in the thickness among the boards, and, hence, drawbacks such as the leaking of resin, insufficient resin filling and defective welding can be avoided in the same manner as the embodiment 1.

Accordingly, the fabrication cost in resin sealing can be reduced.

Other method of fabrication of the semiconductor integrated circuit device according to the embodiment 2 and other effects which can be obtained by the other fabrication methods are substantially equal to those of the embodiment 1, and, hence, the repeated explanation thereof is omitted.

Although the invention made by inventors of the present has been specifically explained in conjunction with the embodiments 1 and 2, the present invention is not limited to the above-mentioned embodiments 1 and 2, and various modifications can be made without departing from the gist of the present invention.

For example, although cases in which the semiconductor integrated circuit device is constituted of the CSP 43, 50 and the card type package 59 have been explained in conjunction with the above-mentioned embodiments 1 and 2, the above-mentioned semiconductor integrated circuit device may be constituted of other types of semiconductor integrated circuit device, such as a BGA (Ball Grid Array) type display device, a LGA (Land Grid Array) type display device or the like, provided that the semiconductor integrated circuit device is of the resin sealing type which can be assembled by performing resin sealing using the board.

Further, although a case in which the movable pins 1 formed on the upper mold 7 are mounted individually one by one corresponding to respective air vents 7c has been considered in connection with the embodiment 1, 2, the movable pins 1 may be constituted by a member such as a movable block piece formed as one body corresponding to a group of the air vents 7c.

Further, the board may be a metal plate, such as a lead frame, irrespective of the board over which the printed wiring is formed.

The advantageous effects which are obtained by the invention among the features disclosed in the present application are briefly recapitulated as follows.

Since the resin sealing is performed with air vents having depths that are set to a fixed value irrespective of the thickness of the board, insufficient resin filling, leaking of resin or imperfect welding within the cavity can be avoided, and the yield rate of the products can be enhanced.

What is claimed is:

1. A fabrication method of a semiconductor integrated circuit device comprising the steps of:
   (a) forming a board;
   (b) mounting semiconductor chips over the board;
   (c) arranging the board over which the semiconductor chips are mounted over a mold surface of a mold for resin molding and, thereafter, closing the mold; and
   (d) setting depths of air vents communicating with cavities of the mold to a fixed value by a movable air vent portion and filling sealing resin in the inside of the cavities.

2. A fabrication method of a semiconductor integrated circuit device according to claim 1, wherein the board is a multilayered printed wiring circuit board.

3. A fabrication method of a semiconductor integrated circuit device according to claim 2, wherein a plurality of the multilayered printed wiring circuit boards are prepared in the step (a) and the mold is closed after the plural multilayered printed wiring circuit boards are arranged over a mold surface of one mold in the step (c).

4. A fabrication method of a semiconductor integrated circuit device according to claim 2, wherein a core member of the multilayered printed wiring circuit board is formed of resin.

5. A fabrication method of a semiconductor integrated circuit device according to claim 1, wherein the depths of the air vents are set to the fixed value by pushing the board to the mold surface using movable pins which are formed so as to project into the air vents formed in the mold.

6. A fabrication method of a semiconductor integrated circuit device according to claim 5, wherein a groove is formed in a distal end of each movable pin so as to leak air inside the cavity to the outside of the cavity through the groove of the movable pin when the resin is filled into the cavity.

7. A fabrication method of a semiconductor integrated circuit device according to claim 5, wherein rammers which make the movable pins project to the air vent side when the mold is released are mounted on the mold, and the movable pins are made to project to the air vent side by the rammers at the time of releasing the mold.

8. A fabrication method of a semiconductor integrated circuit device according to claim 5, wherein the movable pins are made to project to the air vent side by being pushed by a pressure of springs.

9. A fabrication method of a semiconductor integrated circuit device according to claim 8, wherein the pressure of the springs is set far smaller than a clamping force of the mold.

10. A fabrication method of a semiconductor integrated circuit device according to claim 5, wherein the movable pins are mounted in the plural air vents and the depths of the air vents are set to a fixed value by the movable air vent portion using the respective movable pins.

11. A fabrication method of a semiconductor integrated circuit device according to claim 5, wherein depths of the movable pins in the air vents at the cavity side are greater than the depths of the movable pins at the outside thereof.

12. A fabrication method of a semiconductor integrated circuit device according to claim 5, wherein a pin diameter of the movable pins is set larger than a vent width of the air vents at the cavity side of the movable pin.

13. A fabrication method of a semiconductor integrated circuit device according to claim 5, wherein the air vents and movable pins which project into the air vents are formed in any one of a first mold and a second mold of the mold, and the depths of the air vents are set to a fixed value by the movable air vent portion, by pushing the board toward the mold surface using the movable pins.

14. A fabrication method of a semiconductor integrated circuit device according to claim 5, wherein the air vents and movable pins which project into the air vents are formed in any one of a first mold and a second mold of the mold, and, at the time of performing resin molding, a film is arranged over a mold surface of a mold over which the movable pins are arranged, the film is made to follow a shape of the air vents and a shape of distal ends of the movable pins by sucking the film through suction holes formed in the mold, thereby setting the depths of the air vents to a fixed value.

15. A fabrication method of a semiconductor integrated circuit device according to claim 1, wherein a plurality of air vents are formed in the mold, and depths of the respective air vents are set to a fixed value by the movable air vent portion at the time of filling resin.

16. A fabrication method of a semiconductor integrated circuit device according to claim 1, wherein in said step (d), the movable air vent portion applies a force of approximately 9.8 to 49 Newtons to said board.

17. A fabrication method of a semiconductor integrated circuit device according to claim 1, wherein said movable air vent portion is in a mold portion of said mold and movable relative to said mold portion of said mold.

18. A fabrication method of a semiconductor integrated circuit device comprising the steps of:
   (a) preparing a multilayered printed wiring circuit board over which a plurality of device forming regions respectively having chip mounting portions are formed in a matrix array;
   (b) mounting semiconductor chips on the chip mounting portions of the multilayered printed wiring circuit board;
   (c) arranging the multilayered printed wiring circuit board over which semiconductor chips are mounted on a mold surface of mold for resin molding and, thereafter, closing the mold by collectively covering the plural device forming regions of the multilayered printed wiring circuit board with one cavity of the mold;
   (d) setting depths of air vents communicating with the cavity of the mold to a fixed value by a movable air vent portion and, thereafter, filling sealing resin in the inside of the cavity; and
   (e) dividing the multilayered printed wiring circuit board into pieces corresponding to the device forming regions after completion of the step (d).

19. A fabrication method of a semiconductor integrated circuit device comprising the steps of:

(a) preparing a plurality of multilayered printed wiring circuit boards over which a plurality of device forming regions respectively having chip mounting portions are formed in a matrix array;

(b) mounting semiconductor chips on the chip mounting portions of the multilayered printed wiring circuit boards;

(c) arranging the multilayered printed wiring circuit boards over which semiconductor chips are mounted on a mold surface of mold for resin molding and, thereafter, closing the mold by collectively covering the plural device forming regions of the plural multilayered printed wiring circuit boards with respective one of a plurality of cavities of the mold;

(d) setting depths of air vents communicating with the plural cavities of the mold to a fixed value by a movable air vent portion and, thereafter, filling sealing resin in the inside of the cavities; and (e) dividing the plural multilayered printed wiring circuit boards into pieces corresponding to the device forming regions after completion of the step (d).

* * * * *